(12) United States Patent
Ikehashi et al.

(10) Patent No.: US 6,825,524 B1
(45) Date of Patent: Nov. 30, 2004

(54) SEMICONDUCTOR INTEGRATED CIRCUIT DEVICE

(75) Inventors: Tamio Ikehashi, Yokohama (JP); Takashi Ohsawa, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/698,526

(22) Filed: Nov. 3, 2003

(30) Foreign Application Priority Data

Aug. 29, 2003 (JP) .......................................... 2003-307202

(51) Int. Cl.[7] ....................... H01L 29/76; H01L 29/788; H01L 27/01; H01L 27/12
(52) U.S. Cl. ....................... 257/314; 257/316; 257/347; 257/378
(58) Field of Search ............................... 257/314–322, 257/347, 378

(56) References Cited

U.S. PATENT DOCUMENTS

| 5,350,938 A | * | 9/1994 | Matsukawa et al. ........ 257/316 |
| 5,355,330 A | | 10/1994 | Hisamoto et al. |
| 6,653,175 B1 | * | 11/2003 | Nemati et al. .............. 438/133 |

FOREIGN PATENT DOCUMENTS

| JP | 5-347419 | 12/1993 |
| JP | 2002-246571 | 8/2002 |
| JP | 2003-31693 | 1/2003 |

OTHER PUBLICATIONS

T. Ohsawa, et al., "Memory Design Using One Transistor Gain Cell on SOI", ISSCC Digest of Technical Papers, ISSCC 2002/ Session 9/ Dram and Ferroelectric Memories/ 9.1, Feb. 2002, pp. 152–153 and 454.

* cited by examiner

*Primary Examiner*—Cuong Nguyen
(74) *Attorney, Agent, or Firm*—Oblon, Spivak, McClelland, Maier & Neustadt, P.C.

(57) ABSTRACT

A semiconductor integrated circuit device includes: a substrate; a first conductivity type of semiconductor layers arranged above the substrate as being insulated from the substrate and insulated from each other; cell transistors formed on the respective semiconductor layers, each of which has a second conductivity type of source, drain layers and a gate electrode to store data in a channel body thereof corresponding to an accumulation state of majority carriers; and the first conductivity type of emitter layers formed in the respective semiconductor layers to be contacted to the respective drain layers of the cell transistors so as to constitute PN junctions therebetween, the emitter layers serving for injecting majority carriers into the respective channel bodies of the cell transistors.

18 Claims, 21 Drawing Sheets

Bias Condition of Read

Memory Cell Array

"1" WRITE

[PRIOR ART]

[PRIOR ART]

Bias Condition of Unselected Cell

[PRIOR ART]

SEMICONDUCTOR INTEGRATED CIRCUIT DEVICE

CROSS-REFERENCE TO RELATED APPLICATION

This application is based on and claims the benefit of priority from the prior Japanese Patent Application No. 2003-307202, filed on Aug. 29, 2003, the entire contents of which are incorporated herein by reference.

BACKGROUND OF THE INVENTION

1. Field of the Invention

This invention relates to a semiconductor integrated circuit device. More particularly, the invention relates to a memory device formed on a silicon-on-insulator (SOI) substrate, a channel body of which stores data determined by majority carrier accumulation states.

2. Description of Related Art

Recently, for the purpose of alternative use or replacement of conventional DRAMs, a semiconductor memory device that has a more simplified cell structure for enabling achievement of dynamic storability has been provided. This type memory device is disclosed, for example, in Takashi Ohsawa et al., "Memory Design Using One-Transistor Gain Cell on SOI", ISSCC Digest of Technical Papers, 2002, pp. 152–153. A memory cell is formed of a single transistor which has an electrically floating body (channel body) as formed on a silicon-on-insulator (SOI) substrate. This memory cell stores two-value data as follows: a first data (for example, logic "1" data) is stored as a state that an excess number of majority carriers are accumulated or stored in the body; and a second data (for example, logic "0" data) is stored as a state that the excessive majority carriers are drawn out from the body.

The memory cell of the type stated above will be referred to hereinafter as a "floating-body cell (FBC)". A semiconductor memory using FBCs will be referred to as a "FBC memory". The FBC memory makes use of no capacitors unlike currently available standard DRAM chips so that the memory cell is simpler in memory cell array structure and smaller in unit cell area than ever before. Thus, the FBC memory is readily scalable in cell structure and advantageously offers much enhanced on-chip integration capabilities. FIG. 24 shows an equivalent circuit of a cell array in the FBC memory.

For writing logic "1" data in the FBC memory, impact ionization near the drain of a memory cell is utilized. More specifically, as shown in FIG. 25, giving an appropriate bias condition for permitting flow of a significant channel current in the memory cell, majority carriers (holes in this case) are generated by impact ionization and stored in the floating body. Writing logic "0" data is performed by setting a PN junction between the drain and the body in a forward bias state, as shown in FIG. 26, thereby releasing the body's majority carries toward the drain side.

A difference in the carrier storage states of the floating body appears as a difference in threshold voltage of a transistor. Thus, detecting whether an appreciable cell current is present or absent, alternatively, whether the cell current is large or small in magnitude, by applying a read voltage to the gate of a selected memory cell, as shown in FIG. 27, it is possible to determine or sense whether the resultant read data is a logic "0" or "1". FIG. 28 shows a characteristic of drain current Ids versus gate voltage Vgs of the memory cell with respect to data "0" and "1".

When letting the body be unprocessed for an increased length of time period, the excessive majority carriers of the body will be drawn out through the PN junctions at the drain and source. Therefore, it is required to perform refresh operations at constant time intervals as in ordinary DRAMs.

To improve the characteristics of the FBC memory, it has also been proposed to employ an auxiliary gate which is capacitively coupled to the floating body in addition to the main gate. This approach is disclosed, for example, in Japanese Patent Application Laid Open No. 2002-246571 (Patent Document 1) and Japanese Patent Application Laid Open No. 2003-31693 (Patent Document 2).

Similar memory devices have been proposed, for example, in U.S. Pat. No. 5,448,513 specification (Patent Document 3), U.S. Pat. No. 5,784,311 specification (Patent Document 4) and U.S. Pat. No. 6,111,778 specification (Patent Document 5). These memory devices have a different write scheme, while employing carrier accumulation in the floating body as similar to the above described FBC memory. That is, these memory cells are formed of a PMOS transistor as a cell transistor and an NMOS transistor for injecting carriers into the floating body of the PMOS transistor. These PMOS and NMOS transistors have a common gate.

It has also been proposed a method of employing a bipolar operation for injecting carriers into a floating body through a tunnel insulating film, for example, in Japanese Patent Application Laid Open No. 5-347419 (Patent Document 6) and U.S. Pat. No. 5,355,330 specification (Patent Document 7).

In the FBC memory devices proposed up to the present, since the impact ionization current is small, it takes a long time for writing data "1". For reducing the "1" write time, it is desirable to set the bit line voltage (drain voltage) in the "1" write bias condition shown in FIG. 25 to be more higher, thereby increasing the impact ionization current. Unfortunately, this takes the risk of erroneous write in non-selected cells. This situation will be explained in detail referring to FIG. 29.

FIG. 29 shows a bias relationship for a selected cell into which "1" data is written and a non-selected cell. When the gate (word line WL) of the non-selected cell is set at $-1.5V$, $\Delta V=3V$ is applied between the gate and drain thereof. Due to this voltage $\Delta V$, gate induced drain leak (GIDL) flows in the drain of the non-selected cell. Setting the bit line voltage to be higher for reducing the "1" write time of the selected cell, the GIDL current becomes large in the non-selected cell. Therefore, when the non-selected cell is held at a "0" data state, "1" data may be erroneously written into it.

Another problem of "1" write by use of impact ionization is in a fact that power consumption is large. Since the "1" write cell operates in a pentode region (current saturation region), a large drain current (channel current) flows therein. The impact ionization current is about 1/10000 times as much as the drain current. Therefore, the drain current serves little for charging the body capacitance, thereby being uselessly consumed. In a case that "1" write is performed for many cells in a chip, the power supply voltage may be reduced due to the entire drain currents to lead to an erroneous operation.

SUMMARY OF THE INVENTION

According to an aspect of the present invention, there is provided a semiconductor integrated circuit device including:

a substrate;

a first conductivity type of semiconductor layers arranged above the substrate as being insulated from the substrate and insulated from each other;

cell transistors formed on the respective semiconductor layers, each of which has a second conductivity type of source, drain layers and a gate electrode to store data in a channel body thereof corresponding to an accumulation state of majority carriers; and the first conductivity type of emitter layers formed in the respective semiconductor layers to be contacted to the respective drain layers of the cell transistors so as to constitute PN junctions therebetween, the emitter layers serving for injecting majority carriers into the respective channel bodies of the cell transistors.

DETAILED DESCRIPTION OF THE EMBODIMENTS

Illustrative embodiments of this invention will be explained with reference to the accompanying drawings below.

[Summary of Memory Cell]

Figure 1A:
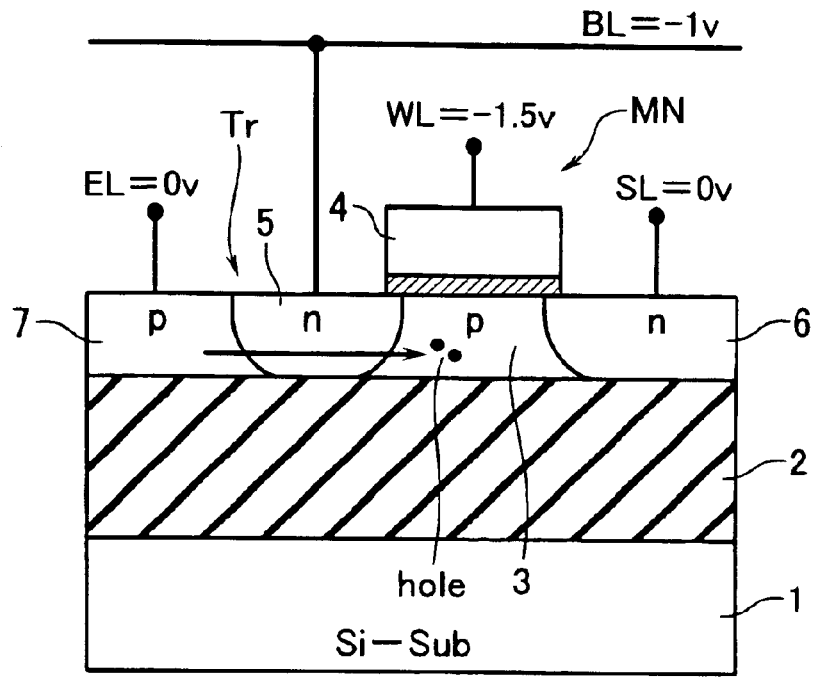
FIGS. 1A and 1B show a sectional view of a memory cell and an equivalent circuit thereof in accordance with an embodiment of the present invention.
Figure 1B:
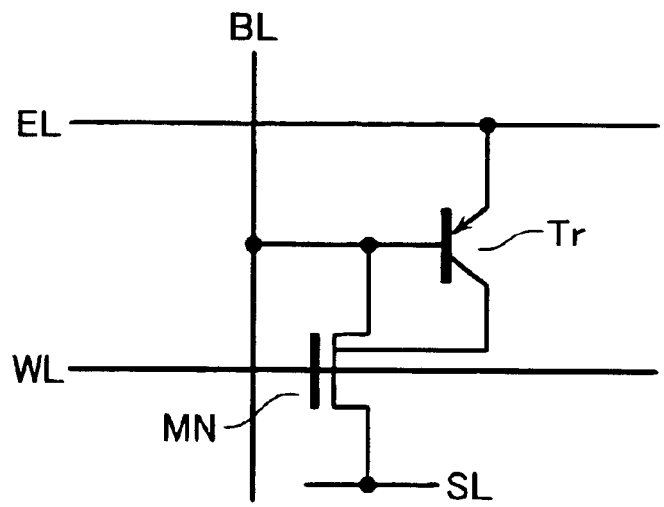

FIG. 1A shows a sectional structure of a memory cell (FBC) in accordance with an embodiment of the present invention. FIG. 1B shows an equivalent circuit of the memory cell. There is prepared an SOI substrate having a silicon substrate 1 and a p-type silicon layer 3 formed thereabove as being insulated from the substrate 1 by an insulating film 2 such as a silicon oxide film. An NMOS transistor MN, which serves as a cell transistor, has a gate electrode 4 formed above the p-type silicon layer 2 with a gate insulating film interposed therebetween, and drain and source layers 5 and 6 which are formed as being self-aligned with the gate electrode 4. A channel body, which is defined as a region underlying the gate electrode 4 in the p-type silicon layer 3, is a floating body which is electrically independent from other cell regions.

A p-type emitter layer 7 is formed in the p-type layer 3 as being contacted to the drain layer 5 so as to constitute a PN junction therebetween, and as being opposite to the channel body.

The p-type emitter layer 7, n-type drain layer 5 and p-type channel body constitute a write-use PNP bipolar transistor Tr in which the n-type drain layer 5 and p-type channel body serve as base and collector, respectively.

The gate electrode 4, drain layer 5 and source layer 6 of the FBC are connected to word line WL, bit line BL which intersects the word line WL, and source line SL, respectively. The emitter layer 7 is connected to an emitter line EL which is disposed in parallel with the word line WL.

The memory cell of this embodiment dynamically stores a first data state (i.e., "1" data) that the channel body of the cell transistor holds excessive majority carries (holes in this case) or a second data state (i.e., "0" data) that the channel body holds less majority carries than the first data state.

FIG. 1A shows an example of a bias condition at "1" write time of the memory cell. During "1" writing, −1.5V, −1V and 0V are applied to the word line WL, bit line BL and emitter line EL, respectively. The source line SL is held at 0V.

Under the bias condition, the PN junction between the p-type emitter layer 7 and n-type drain layer 5 (i.e., emitter-base junction) is forward-biased, whereby the emitter layer 7 injects holes into the drain layer 5. The injected holes are partially lost by recombination in the drain layer 5, and the remaining reach to the p-type channel body. In other words, "1" write is defined as a hole-injection operation into the channel body by use of an on-state of the bipolar transistor. This write operation will be referred to as "bipolar write" hereinafter.

According to the bipolar write, controlling the voltage between the emitter line EL and bit line BL, it becomes easy to increase a current (i.e., collector current) carried into the channel body. In other words, it becomes possible to do high-speed "1" write. Further, in the bipolar write, gate (i.e., unselected word line) and drain (i.e., selected bit line) of an unselected cell transistor disposed along the selected bit line BL are set at −1.5V and −1V, respectively. Therefore, gate-drain voltage thereof is smaller than that in the conventional "1" write mode by use of impact ionization. As a result, it is possible to reduce the erroneous write due to GIDL current in the unselected cell.

When the bipolar write is done under the bias condition shown in FIG. 1A, the ratio of a current component (i.e., base current) flowing into bit line BL via drain layer 5 in the emitter current and another current component (i.e., collector current) reaching the channel body via the drain layer 5 in the emitter current is expressed by $1/h_{FE}$ ($h_{FE}$ is a current amplification coefficient of the bipolar transistor Tr). This value is dependent on the impurity concentration and width of the drain layer 5.

To secure cut-off characteristic and punch-through characteristic in the miniaturized cell transistor MN, it is necessary to lower the impurity concentration of the drain and source layers 5 and 6. Due to this, $h_{FE}$ of the bipolar transistor Tr in accordance with this embodiment becomes smaller than that of conventional transistors. However, suitably designing the width of the drain layer 5, it is easy to achieve such a property that $h_{FE}$ is set at about from 0.1 to 1. For example, assume that $h_{FE}$ is equal to 1, and the half of emitter current (50%) is carried into the channel body. Therefore, it becomes possible to do high-speed and efficient "1" write without wasteful power consumption.

"0" write is the same as that of the conventional FBC. For example, applying 1.5V to the word line WL to boost the channel body, and applying −2V to the bit line BL, while the bipolar transistor TR is held at an off-state, a forward bias is applied between the channel body and drain layer. As a result, the accumulated holes in the channel body may be released to the drain, whereby "0" data is written as being defined as a state with less excessive holes.

Since the memory cell in accordance with the embodiment dynamically stores data "0" or "1", it is required to do data refresh at certain time intervals.

[Cell Array Arrangement]

Figure 2:
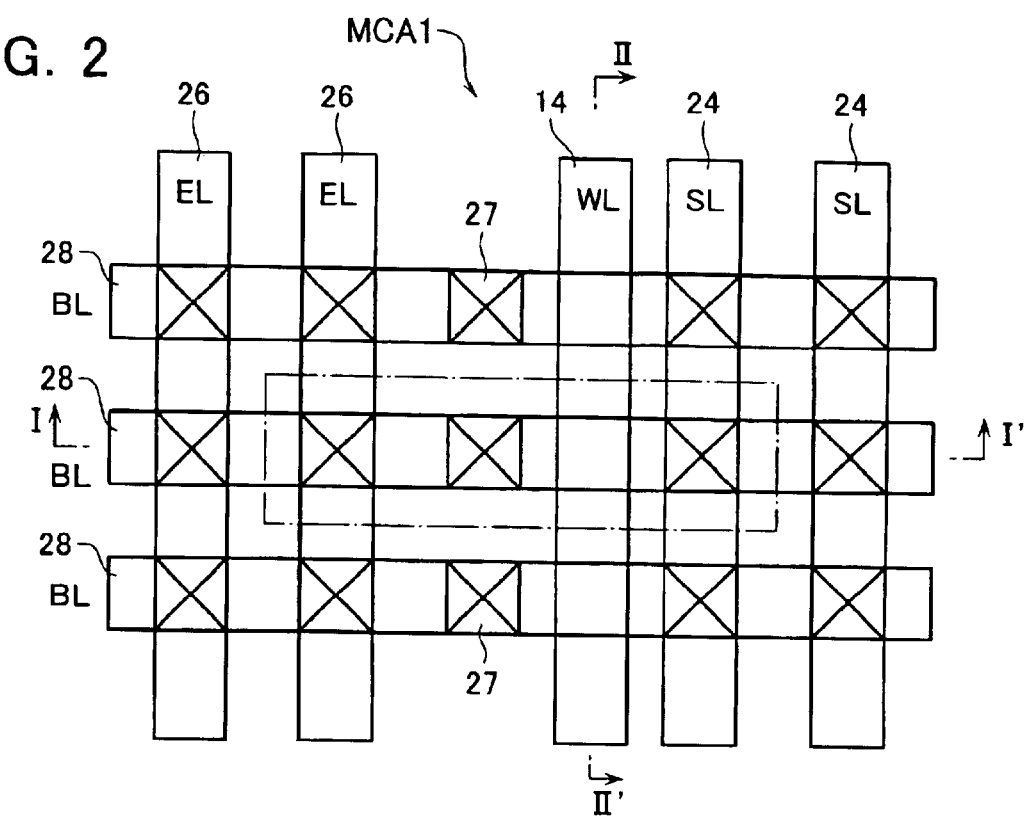
FIG. 2 shows a plan view of a cell array MCA1 in accordance with the embodiment.
Figure 3:
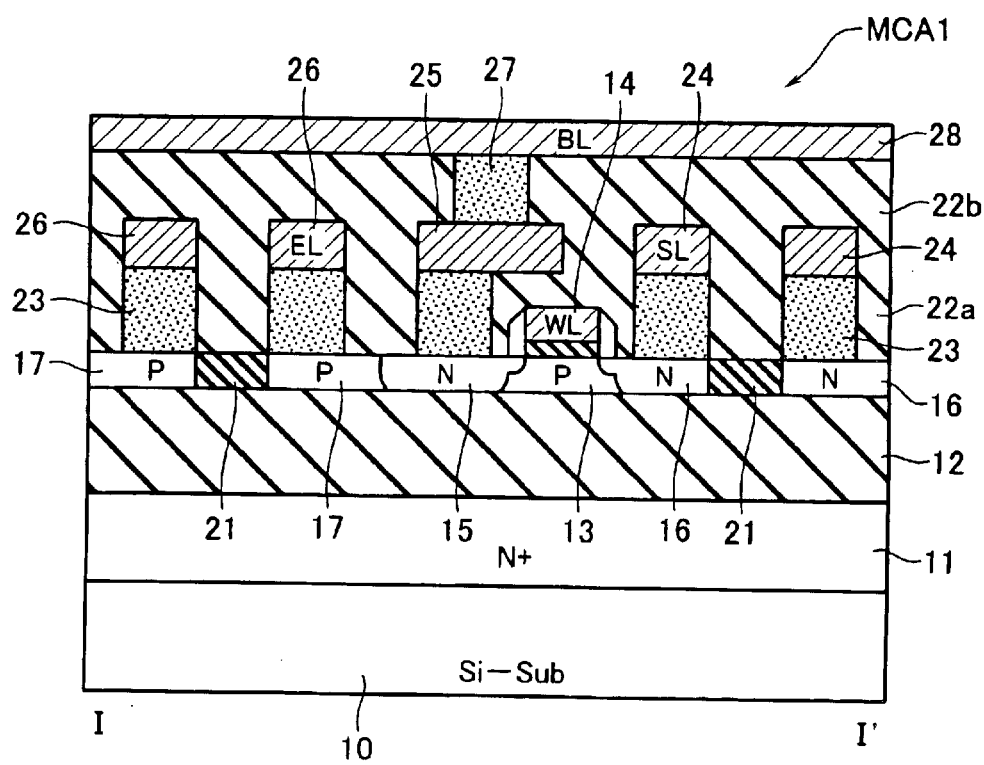
FIG. 3 shows a sectional view taken along line I–I' of FIG. 2.
Figure 4:
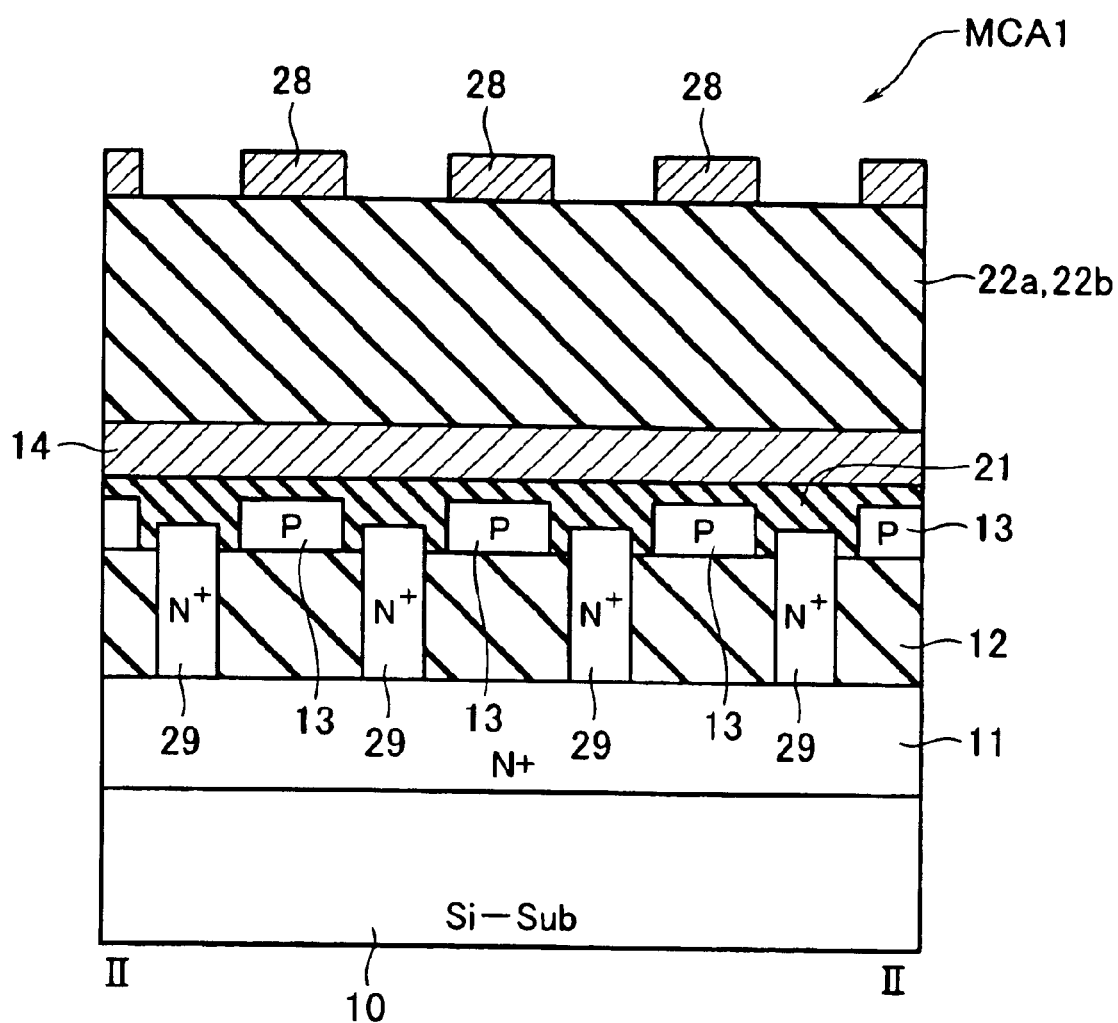
FIG. 4 shows a sectional view taken along line II–II' of FIG. 2.

FIG. 2 shows a plan view of a cell array MCA1 in accordance with this embodiment. FIGS. 3 and 4 show sectional views of the cell array taken along lines I–I' and II–II' in FIG. 3, respectively. An SOI substrate has a silicon substrate 10, on the surface of which an N⁺-type layer 11 is formed, and a p-type silicon layer 13 with an insulator film 12 such as a silicon oxide film interposed therebetween. Burying a device insulating film 21 in the p-type silicon layer 3, the layer 3 is divided into a plural active device regions (i.e., floating bodies) arranged as being separated from each other.

Each NMOS transistor MN serving as a cell transistor has a gate electrode 14 formed above the p-type silicon layer 12 with a gate insulating film interposed therebetween, and drain and source layers 15 and 16 self-aligned with the gate electrode 14. Each gate electrode 14 is, as shown in FIGS. 2 and 4, patterned to be continued in a direction so as to constitute a word line WL shared with plural cells. A p-type emitter layer 17 is formed in the p-type layer 13 as being contacted to the drain layer 15 so as to constitute a PN junction therebetween, and as being opposite to the channel body via the drain layer 15. The p-type emitter layer 17, n-type drain layer 15 and p-type channel body constitute a write-use PNP bipolar transistor Tr in which the n-type drain layer 15 and p-type channel body serve as base and collector, respectively.

The substrate on which cells are formed is covered by interlayer insulating film 22a, and source lines (SL) 24, emitter lines (EL) 26 and intermediate electrodes 25 connected to the respective drain layers 15 are formed as first metal wirings deposited thereon. The source lines 24 and emitter lines 26 are, as shown in FIG. 2, continued in parallel with the word lines (WL) 14, and commonly used by plural cells. These source lines 24, emitter lines 26 and intermediate electrodes 25 are connected to source layers 16, emitter layers 17 and drain layers 15 via contact plugs 23, respectively.

Another interlayer insulating film 22b is deposited over the first metal wirings. Disposed on the interlayer insulating film 22b are bit lines (BL) 28 formed as second metal wirings which intersect the word lines WL and are connected to the drain layers 15 of plural cells. In this example, the bit lines 28 are connected to the intermediate electrodes 25 via contact plugs 27.

The above described wirings and material films thereof may be variously selectable. For example, while metal wirings are connected to underlying wirings and diffusion layers via contact plugs in the above described example, it is possible to simultaneously bury metal wirings and contacts thereof by use of a dual damascene process.

In the cell array MCA1 in accordance with this embodiment, a pillar 29, which serves as an auxiliary gate electrode, is buried in the insulating film 12 of the SOI substrate. The pillar 29 is formed of an N⁺-type silicon layer buried in the insulator film 21, the bottom and top ends of which are contacted to n⁺-layer 11 and capacitively coupled to the lower side surface of the p-type silicon layer 13, respectively. This pillar 29 is negative-biased and serves for making the retention time of hole-accumulated state (data "1" state) be long.

Figure 5:
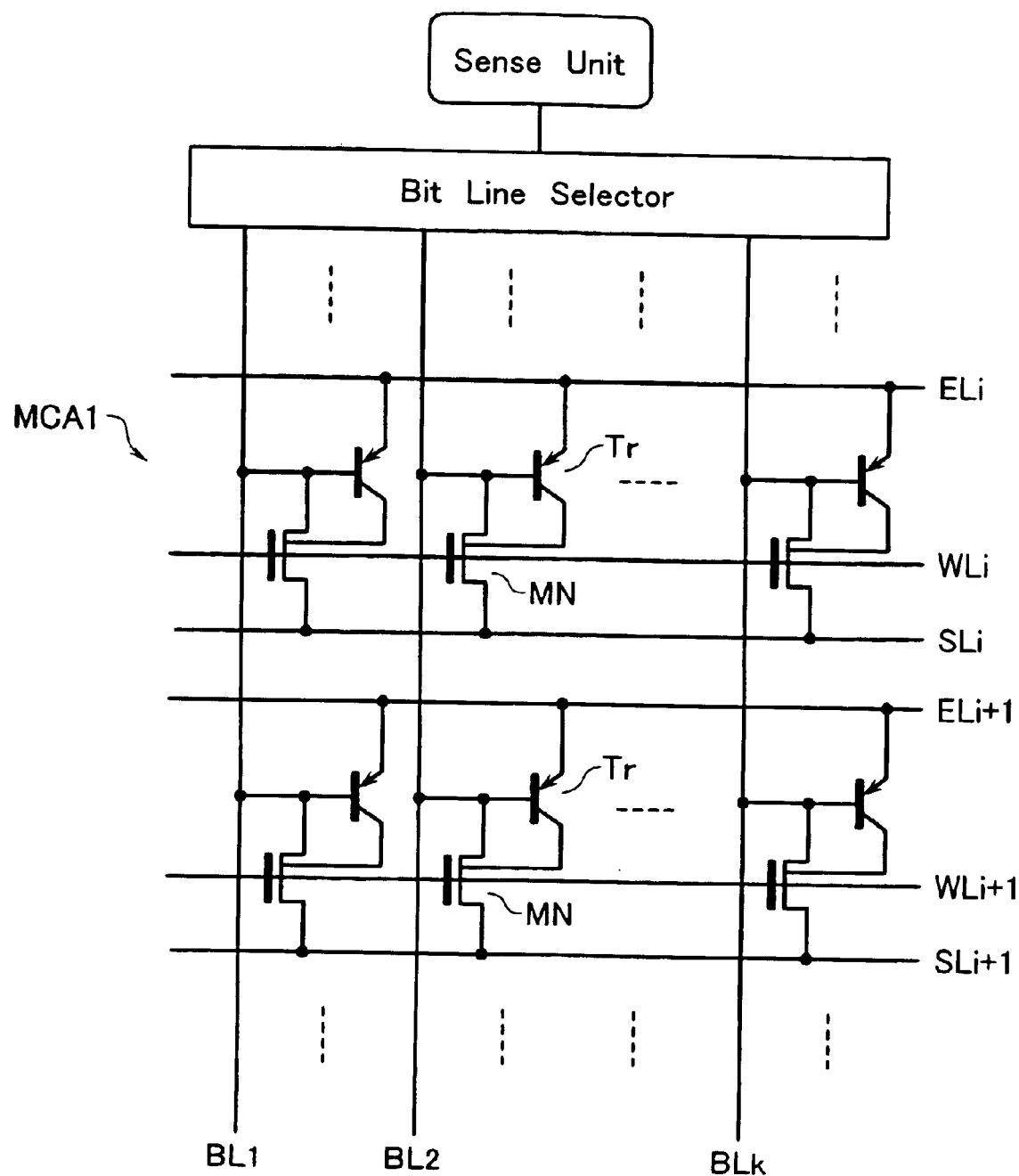
FIG. 5 shows an equivalent circuit of the cell array MCA1.

FIG. 5 shows an equivalent circuit of the cell array MCA1. FBCs, each of which has NMOS transistor MN with a floating body and bipolar transistor TR as the floating body serving as a collector thereof, are disposed at the respective intersections of bit lines BL and word lines WL intersecting each other, and arranged in a matrix manner. The emitter lines EL and source lines SL are in parallel with the word lines WL. Plural bit lines BL are selected by a bit line selector to be selectively connected to a sense unit.

Figure 6:
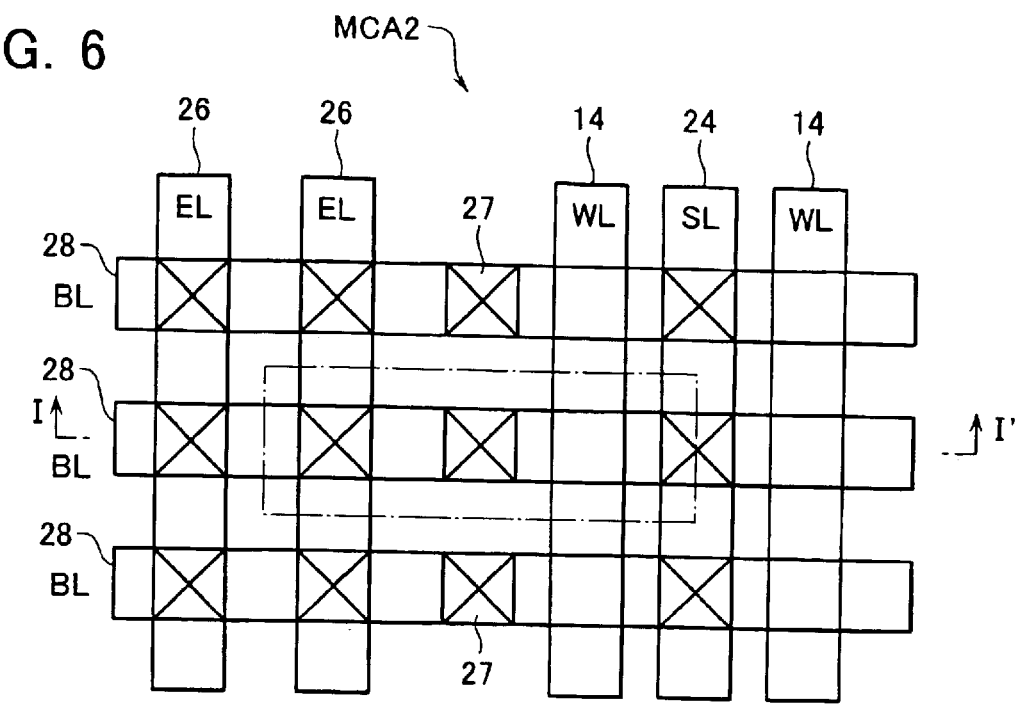
FIG. 6 shows a plan view of another cell array MCA2.
Figure 7:
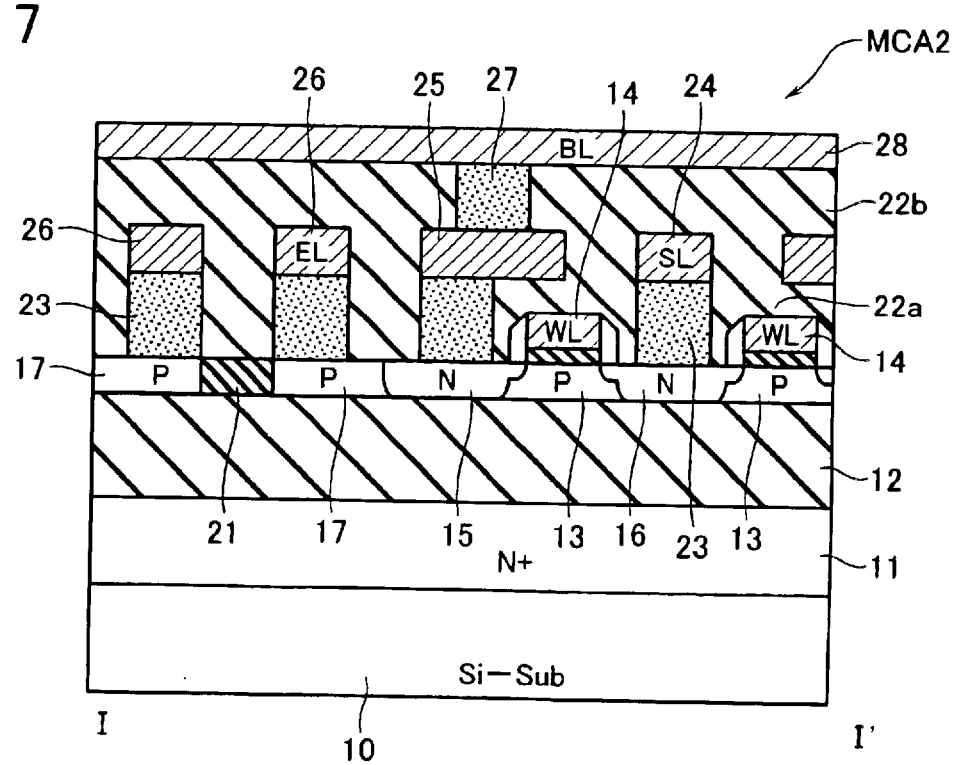
FIG. 7 shows a sectional view taken along line I–I' of FIG. 6.

FIGS. 6 and 7 show plan view of cell array MCA2 with another type and sectional view thereof taken along line I–I', in correspondence with FIGS. 2 and 3, respectively. In the above described cell array MCA1, memory cells arranged along the bit lines BL and word lines WL are formed of the respective p-type silicon layers 13 which are completely separated from each other. Explaining in other words, spaces between source layers 16 of adjacent memory cells and between emitter layers 17 of adjacent memory cells serve as a device insulating area in which the insulating film 21 is buried.

Figure 8:
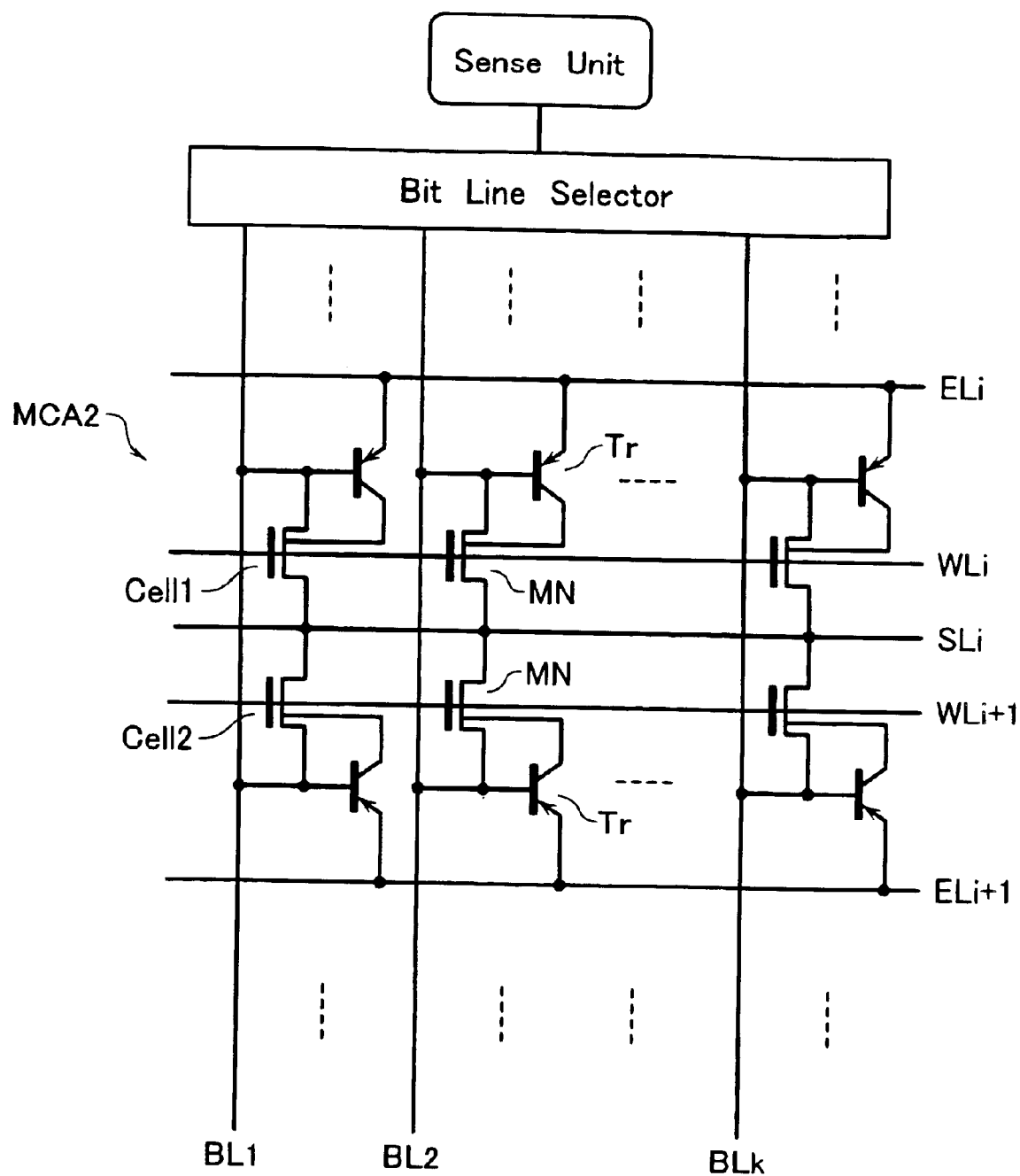
FIG. 8 shows a sectional view taken along line II–II' of FIG. 6.

Contrary to this, in the cell array MCA2 shown in FIGS. 6 and 7, two memory cells disposed adjacent in the direction of bit lines shares a source layer 16, i.e., a source line (SL) 24. In other words, on each of the silicon layers 13 arranged in the direction of bit lines BL and insulated by device insulating film 21, two memory cells are formed with a shared source layer 16. FIG. 8 shows an equivalent circuit of this cell array MCA2 in correspondence with FIG. 5. Sharing source lines 24 as above described, the unit cell area of cell array may be formed smaller.

In the cell array MCA2, if holes injected to a channel body from an emitter layer are further transferred to an adjacent cell's channel body via a source layer during data "1" writing, the adjacent cell's data may be disturbed. To protect cells from being disturbed by such the operation, it is effective to make the impurity concentration of the source layer 6 shared with the adjacent cells be high.

In this embodiment, it should be appreciated that each emitter line (EL) 26 is not shared by two cells disposed adjacent in the direction of the bit line BL. The reason of this is as follows: if emitter lines Eli and Eli+1 in FIG. 8 are united, it becomes impossible to achieve "1" write selectivity between two cells, Cell1 and Cell2, disposed adjacent in the direction of bit line BL.

[Memory Chip Arrangement]

Figure 9:
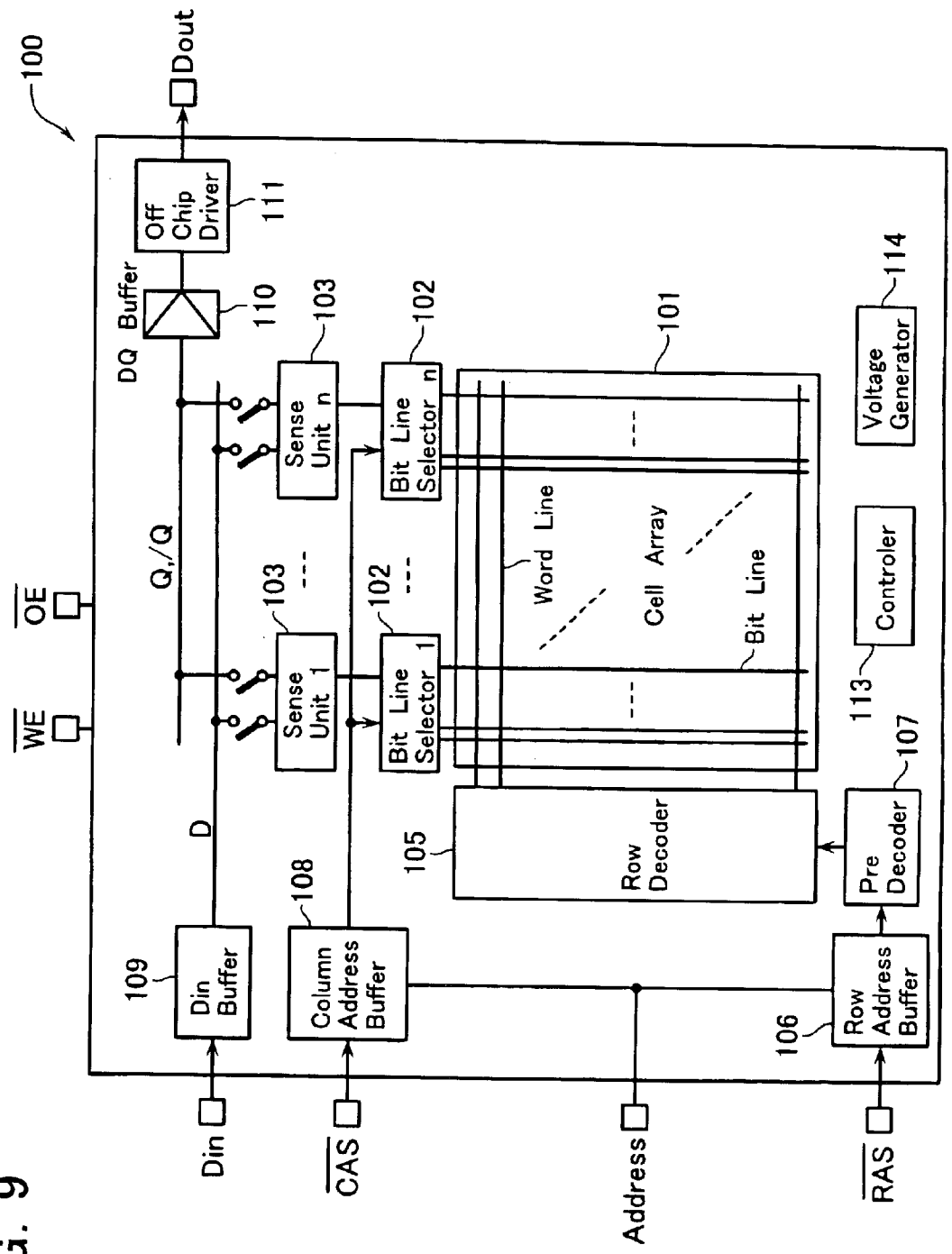
FIG. 9 shows a functional block of a memory chip in accordance with the embodiment.

FIG. 9 shows a functional block configuration of an FBC memory chip 100 in accordance with this embodiment. Memory cell array 101 is preferably grouped into a plurality of cell units each including plural bit lines. Bit lines each are selected in the respective cell units by bit line selectors 102 and connected to sense units 103. In a case that it is difficult to dispose sense amplifiers for the respective bit lines, it is effective to use the above described scheme in which one sense unit 103 is commonly used by plural bit lines. In general, a current sensing type sense amplifier occupies a relatively large area. Therefore, it is difficult to dispose sense amplifiers for the respective bit lines in a cell array with a miniaturized bit line pitch.

Used for the purpose of alternating DRAMs, the FBC memory is configured to have an address multiplexing scheme, which is controlled by column address strobe signal /CAS and row address strobe signal /RAS. Row address signal is input to a row address buffer 106 and transferred to a row decoder 105 via a pre-decoder 107. The row decoder 105 selects a word line WL in response to the row address signal. Column address signal is input to a column address buffer 108 and transferred to the bit line selectors 103, thereby selecting bit lines.

Write data is input from a data input pad Din and supplied to a data bus D. The write data on the data bus D is supplied to a bit line BL selected by the bit line selector 102 via the sense unit 103. Read data is transferred to a data output buffer 110 via read data lines Q, /Q, and output to a data output pad Dout via an off-chip driver 111.

Further disposed on the memory chip 100 are controller 113 for outputting various control signals, a high voltage generation circuit 114 for outputting various internal voltages, and the like.

Figure 10:
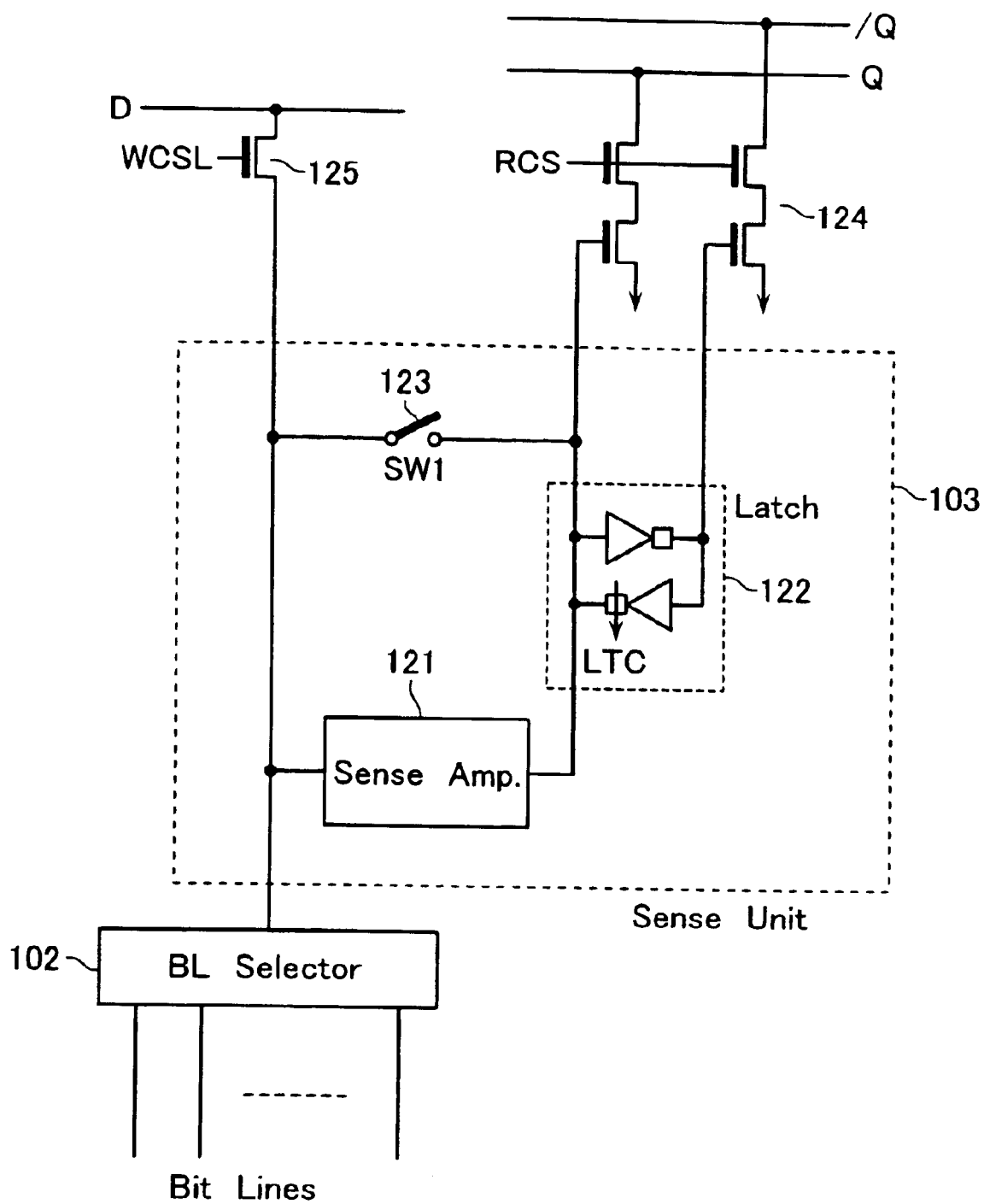
FIG. 10 shows a sense amplifier circuit in the embodiment.

The sense unit 103 has, as shown in FIG. 10, a current sensing type sense amplifier 121 and a data latch 122. The sense amplifier 121 senses a cell current flowing on the bit line BL to determine two-value data (binary data). The read out data of the sense amplifier 121 is held at the data latch 122. The read out data of the data latch 122 is transferred to the data lines Q, /Q via a transfer gate 124 controlled by a read timing signal RCS. The write data supplied to data bus D is transferred to a bit line selected by bit line selector 102 via a transfer gate 125 controlled by a write timing signal WCSL. When data refreshing, the read out data held in the data latch 122 is transferred to the selected bit line again via a transfer gate 123 and are written back to the selected cell.

[Data Write/Read Operation]

Data write and read operations of the FBC memory in accordance with this embodiment will be described bellow. Bias conditions in the respective operation modes will be explained by use of the equivalent circuit shown in FIG. 5.

In the respective operation modes, source line SL is basically fixed in potential. Therefore, in a case that a cell array with a shared source line commonly used by two cells adjacent in the direction of the bit line is used, it is possible to do similar operations. However, it is also possible to selectively set the potential of the source line SL.

Figure 11:
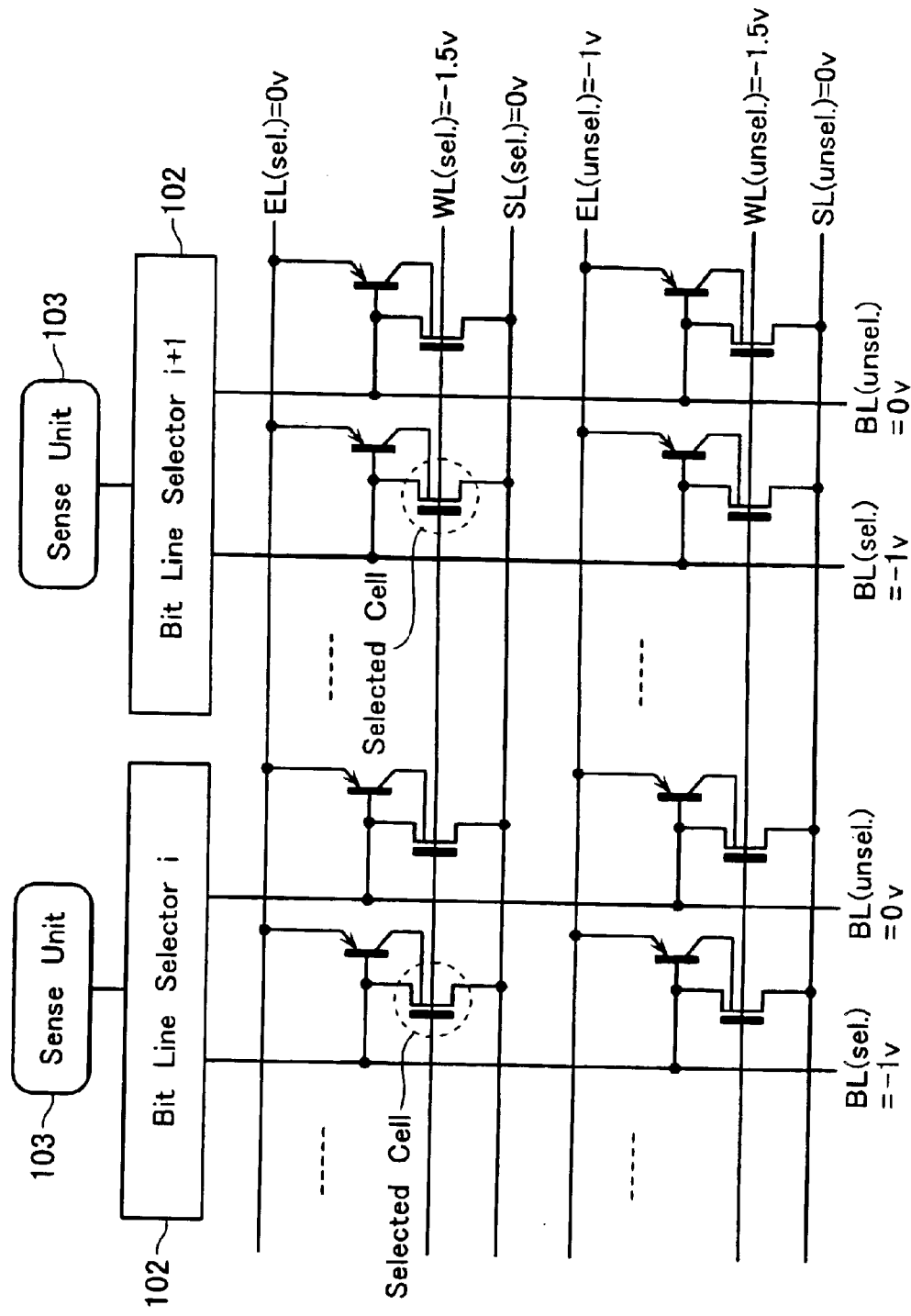
FIG. 11 shows a bias condition at a "1" write time in the embodiment.

FIG. 11 shows a bias condition of a first type "1" write mode (Type1). One bit line selected in a cell unit by bit line selector 102 serves as a selected bit line BL(sel.). −1V is applied to the selected bit lines BL(sel.), and 0V to the remaining unselected bit lines BL(unsel.). Cell selection in the direction of bit lines is performed by selecting emitter lines EL. In detail, 0V is applied to a selected emitter line EL(sel.), and −1V to the remaining unselected emitter lines EL(unsel.). Both selected word line WL(sel.) and unselected word line WL(unsel.) are set at −1.5V. All source lines SL are set at 0V.

Under this condition, in the selected cells disposed at the respective intersections of the selected word line WL(sel.) and selected bit lines BL(sel.), bipolar transistors Tr turn on to inject holes from the emitter layers to the channel bodies of MNOS transistors, whereby "1" data is written into theses selected cells. In the remaining unselected cells, bipolar transistors being held at an off-state, "1" data is not written.

Figure 12:
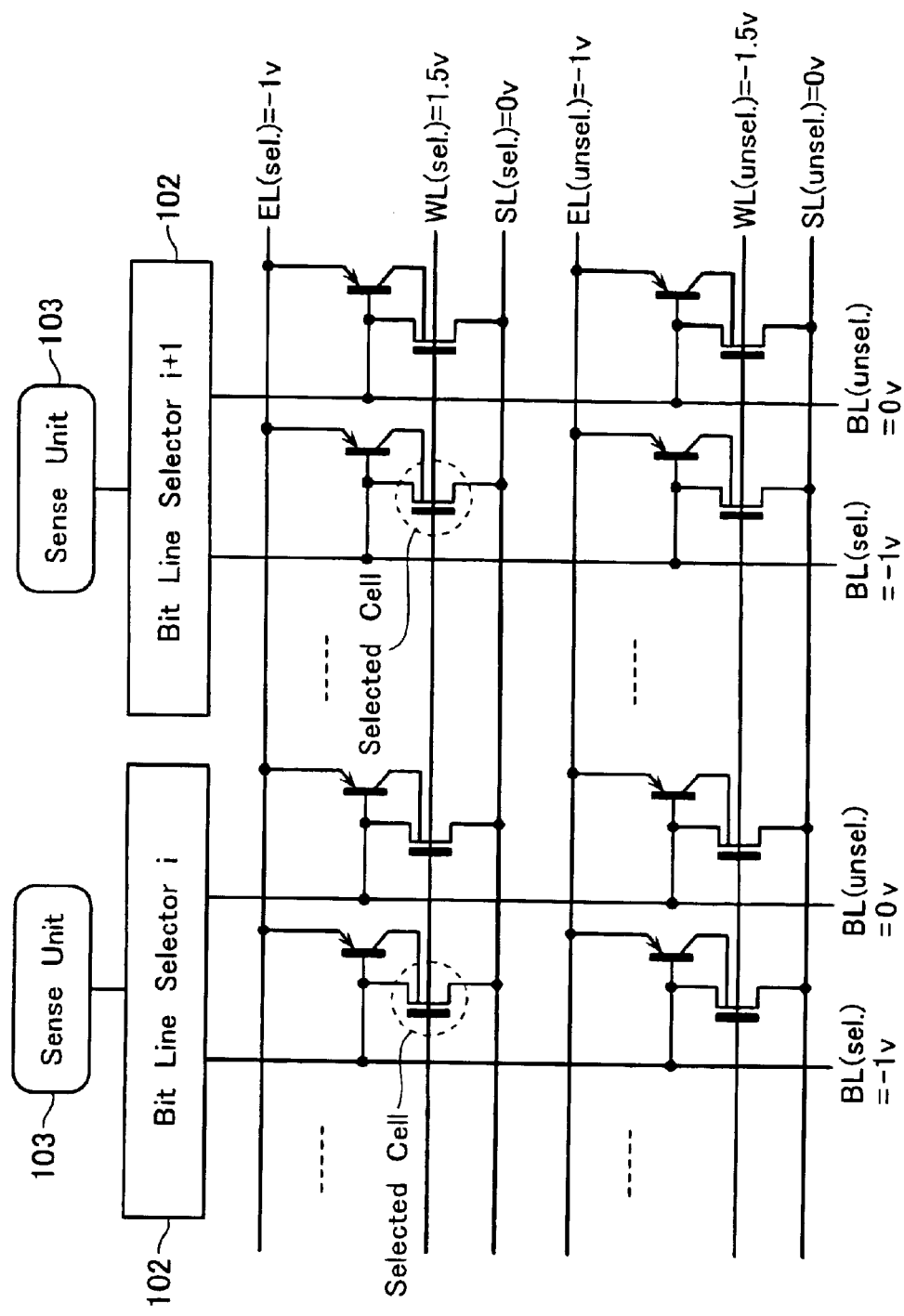
FIG. 12 shows a bias condition at a "0"0 write time in the embodiment.

FIG. 12 shows a bias condition of a "0" write mode. −1V is applied to selected bit lines BL(sel.), and 0V to the remaining unselected bit lines BL(unsel.). 1.5V is applied to a selected word line WL(sel.), and −1.5V to the remaining unselected word lines WL(unsel.). All emitter lines EL and all source lines SL are set at −1V and 0V, respectively.

Under this bias condition, bipolar transistors in the entire memory cells held at the off-state. Forward-biased between the channel bodies and the drain layers in the memory cells at the respective intersections of the selected word line WL(sel.) and selected bit lines BL(sel.), the excessive majority carriers of the channel bodies are released to drain layers, whereby "0" data is written into these selected cells.

Figure 13:
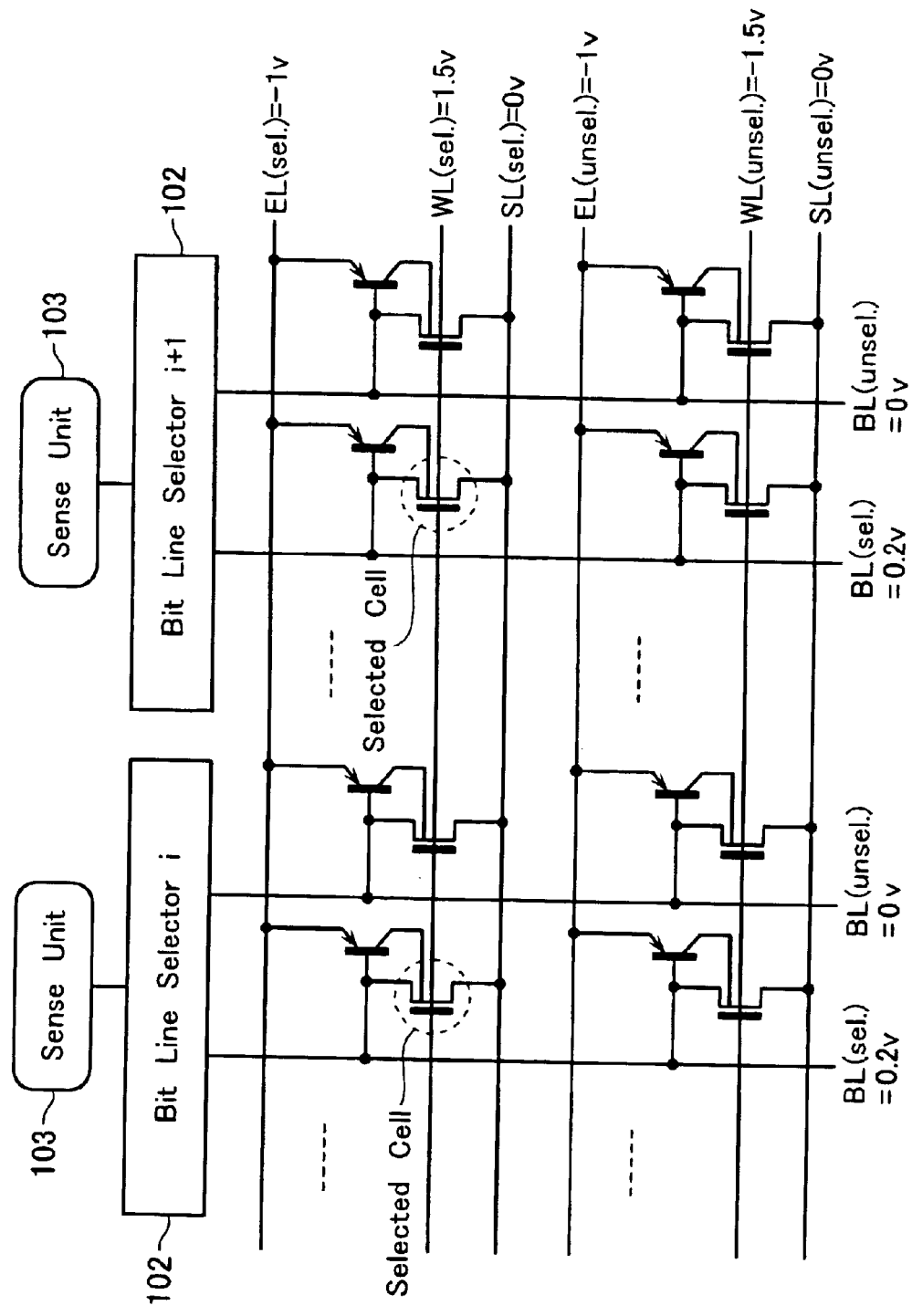
FIG. 13 shows a bias condition at a read time in the embodiment.

FIG. 13 shows a bias condition of a data read mode. In this data read mode, all emitter lines EL being held at 0V, bipolar transistors in the entire cells are held at the off-state. 0V is applied to unselected bit lines BL(unsel.), and 0.2V to selected bit lines BL(sel.). −1.5V is applied to unselected word lines WL(unsel.), and 1.5V to a selected word line WL(sel.). All source lines SL are held at 0V.

Under this bias condition, in the memory cells at the respective intersections of the selected word line WL(sel.) and selected bit lines BL(sel.), cell currents (i.e., drain currents of MOS transistors) flow, which are different corresponding to data. Detecting the cell currents by the sense units, data "0" or "1" is determined.

In a case that data read is done just after "1" write for a selected cell, a selected word line potential swings from −1.5V to 1.5V. In response to this, accumulated carriers (holes) held in the channel body are partially carried out to source and drain layers due to capacitive coupling from the selected word line. However, if the carrier release is a merely transient phenomenon (in other words, if the channel body is higher in potential than that of a "0" data state when the selected word line is restored to −1.5V after data read), there is no problems. In detail, appropriately designing the channel body voltage as a "1" data holding state when the selected word line is restored to −1.5V after data read, it becomes possible to prevent an erroneous operation, while a transient signal is generated at the data read time after "1" write.

Similarly, in a case that just after "1" write for a selected cell, "0" write is done for another cell commonly connected to the selected word line to which the selected cell is connected, the selected word line potential swings from −1.5V to 1.5V. While the accumulated carriers held in the channel body of the "1" write cell are partially released in this case also, a net "1" data will not be lost.

Figure 14:
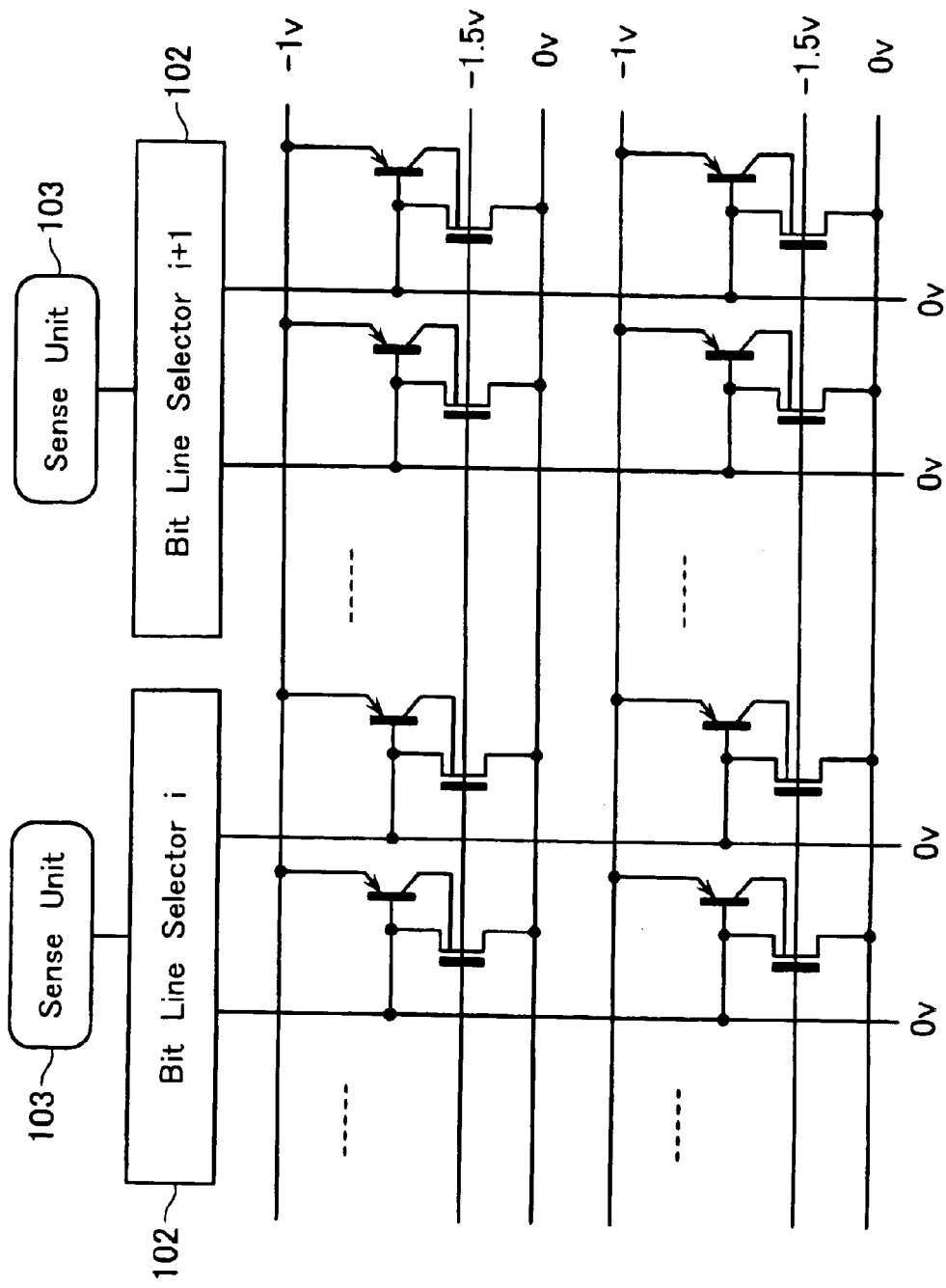
FIG. 14 shows a bias condition at a data hold time in the embodiment.

FIG. 14 shows a bias condition of a data holding state. The entire word lines WL are held at a hold voltage of −1.5V. The entire emitter lines EL and the entire source lines SL are held at −1V and 0V, respectively. Under this bias condition, the entire channel bodies hold a low potential state by capacitive coupling of the word lines, thereby dynamically holding data.

Figure 15:
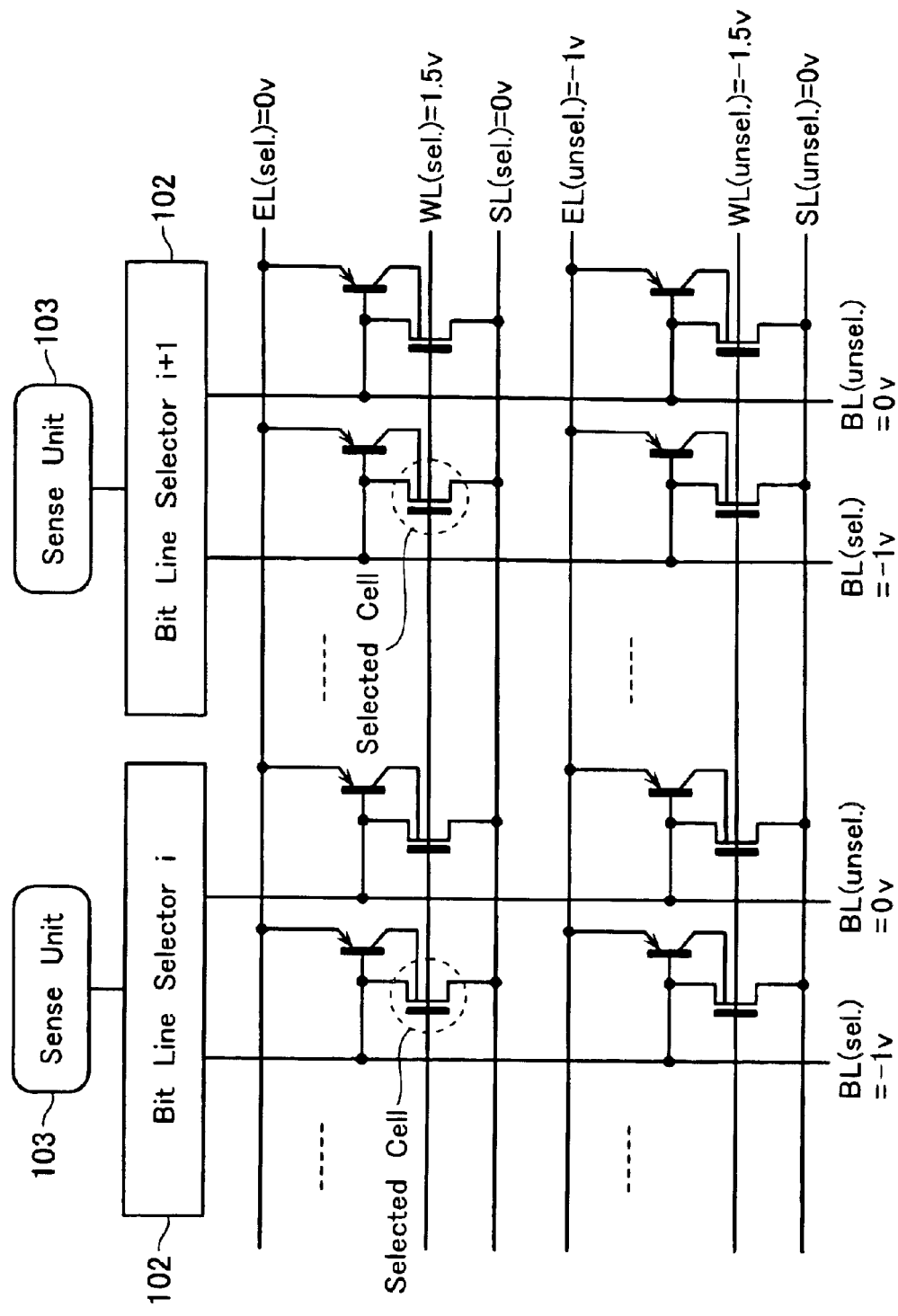
FIG. 15 shows another bias condition at the "1" write time in the embodiment.

FIG. 15 shows a bias condition of a second type "1" data write mode (Type2) different from that shown in FIG. 11. In FIG. 11, while the entire word lines WL are held at the hold voltage of −1.5V, cell selection is done by selecting bit lines BL and emitter lines EL. In contrast to this, in this "1" data write mode, Type2, 1.5V is applied to a selected word line WL(sel.) as similar to the "0" write mode. The remaining biases are the same as those shown in FIG. 11.

This bias condition is the same as that in the "0" write mode except the emitter line voltage. Therefore, while a selected cell is set at a "0" write mode, "1" write (bipolar write) is simultaneously generated at the selected cell based on hole-injection from the emitter layer to the channel body, whereby the "1" data state is written. Since both source and drain are held at 0V in the unselected cells sharing the word line with the selected cell, there is no data destruction.

Figure 16:
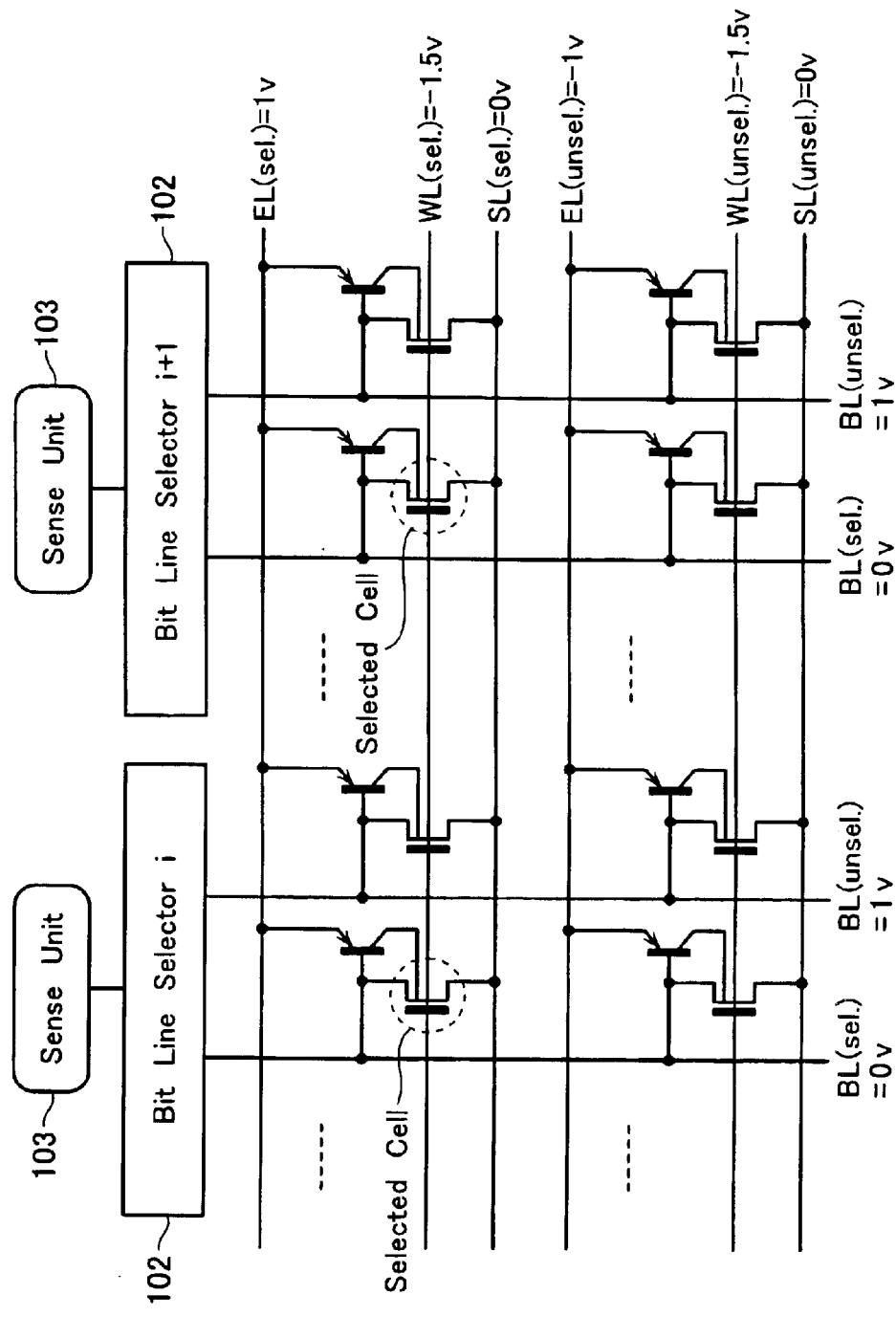
FIG. 16 shows another bias condition at the "1" write time in the embodiment.

FIG. 16 shows a bias condition of a third type "1" write mode (Type3). −1.5V is applied to both selected word line WL(sel.) and unselected word lines WL(unsel.). 0V is applied to selected bit lines BL(sel.), and 1V to a selected emitter line EL(sel.). Under this bias condition, bipolar write being generated at the selected cells based on the hole injection from the emitters, "1" write is preformed in these selected cells. Applying 1V and −1V to unselected bit lines BL(unsel.) and unselected emitter lines EL(unsel.), respectively, data destruction is not occurred in the entire unselected cells including ones disposed along the selected word line WL(sel.) and the others disposed along the unselected word lines WL(unsel.).

Figure 17:
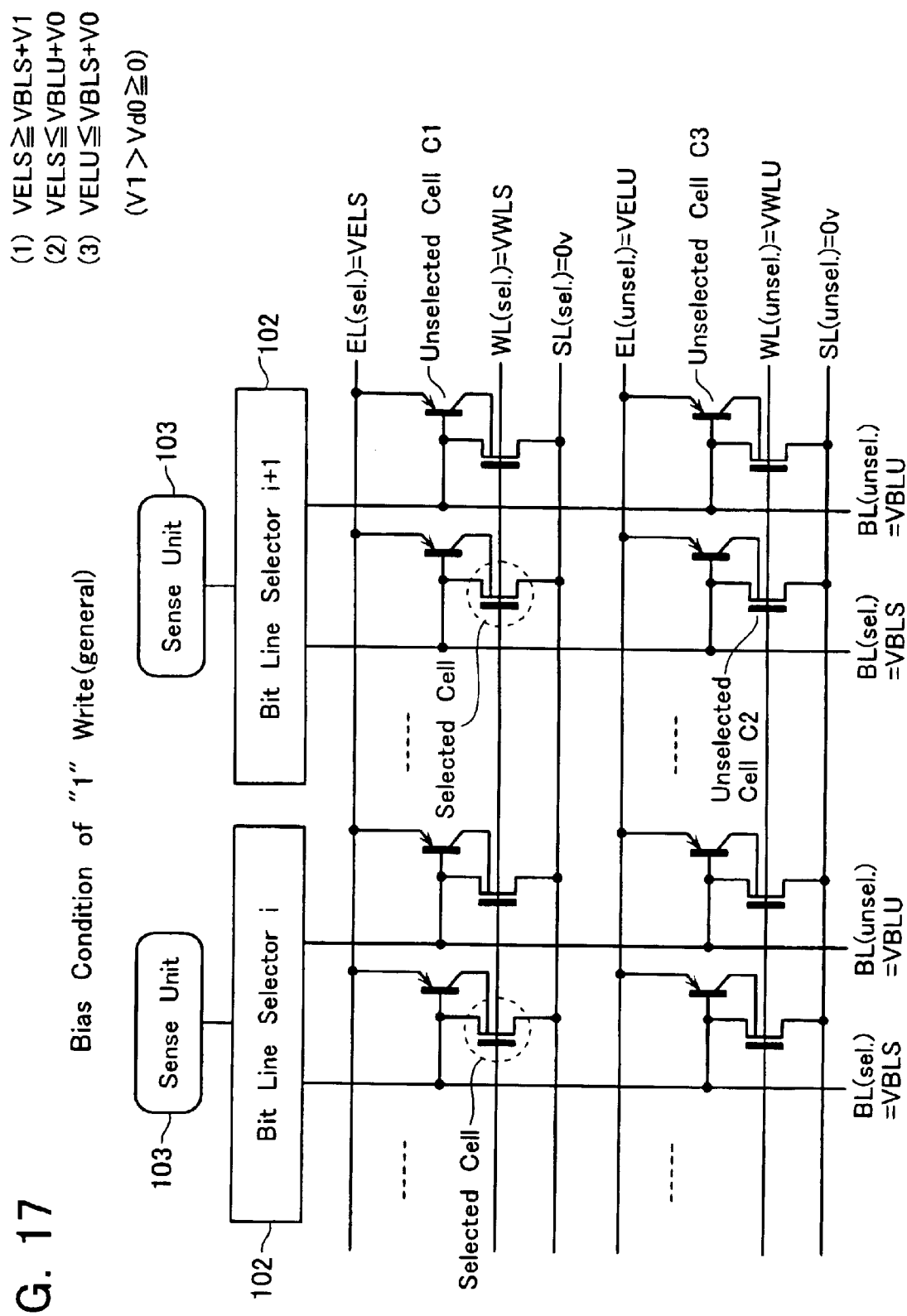
FIG. 17 is a diagram for explaining a generalized bias condition at the "1" write time in the embodiment.

So far, there have been described three types of "1" data write, Type1 to Type3. Next, a generalized bias condition of "1" data write will be explained referring to FIG. 17. As shown in FIG. 17, voltages applied to selected word line WL(sel.) and unselected word line WL(unsel.) are referred to as VWLS and VWLU, respectively. Voltages applied to selected bit line BL(sel.) and unselected bit line BL(unsel.) are referred to as VBLS and VBLU, respectively. Voltages applied to selected emitter line EL(sel.) and unselected emitter line EL(unsel.) are referred to as VELS and VELU. The entire source lines SL are set at 0V.

In FIG. 17, there are shown two selected cells selected by one selected word line WL(sel.), one selected emitter line EL(sel.) and two selected bit lines BL(sel.), while three kinds of unselected cells are shown as follows: unselected cell "C1" simultaneously driven by selected word line WL(sel.) with the selected cells; unselected cell "C2" disposed along the unselected word line WL(unsel.) and connected to selected bit line BL(sel.); and unselected cell "C3" disposed along the unselected word line WL(unsel.) and connected to unselected bit line BL(unsel.).

Assume here that the base-emitter junction of bipolar transistor Tr in the selected cell is sufficiently forward-biased when voltage thereof is equal to or higher than V1, whereby the selected cell is set in a bipolar write mode. In other words, the voltage V1 is one that is sufficient to transfer the holes injected from the emitter layer to the channel body. As apparent from this condition, to do "1" write in the selected cell, it is required to satisfy the following expression (1) between the selected bit line voltage VBLS and selected emitter line voltage VELS.

$$VBLS + V1 \leq VELS \tag{1}$$

The lowest value of V1 is about 1V. In addition to the above described assumption, assume that the base-emitter junction of bipolar transistor Tr in the selected cell is insufficiently forward-biased when voltage thereof is equal to or lower than V0, whereby the selected cell is not set in a bipolar write mode. In other words, the voltage V0 is one that is insufficient to force the emitter to inject holes into the drain layer, or insufficient to transfer the injected holes to the channel body, even if hole-injection takes place. It is not necessary to set the voltage V0 at 0V. For example, using V0=0.3V, the base-emitter junction is weakly forward-biased. However, the amount of holes injected from the emitter layer to the base (drain) layer being small, the injected holes will be mostly lost by recombination in the drain layer, and do not reach the channel body. Therefore, a condition that "1" write does not take place in the unselected cell C1 shown in FIG. 17 is expressed by the following expression (2).

$$VELS \leq VBLU + V0 \tag{2}$$

Similarly, a condition that "1" write does not take place in the unselected cell C2 shown in FIG. 17 is expressed by the following expression (3).

$$VELU \leq VBLS + V0 \tag{3}$$

Further, a condition that "1" write does not take place in the unselected cell C3 shown in FIG. 17 is expressed by the following expression (4).

$$VELU \leq VBLU + V0 \tag{4}$$

It is appreciated that the expression (4) is automatically drawn from the expressions (1) to (3). In detail, drawn from the expressions (1) and (2) is the following expression (5).

$$0 < V1 - V0 \leq VBLU - VBLS \tag{5}$$

Further, the following expression (6) is drawn from the expressions (5) and (3).

$$VELU \leq VBLS + V0 < VBLU + V0 \tag{6}$$

As described above, it should be appreciated that satisfying the expressions (1) to (3), "1" write becomes possible, while preventing the unselected cell from being erroneously written.

Next, with respect to the word line voltages, it may be set under a condition that voltage VWLU of unselected word line WL(unsel.) is equal to voltage VWLS of selected word line WL(sel.), as shown in the following expression (7).

$$VWLS = VWLU = V2 \tag{7}$$

Figure 29:
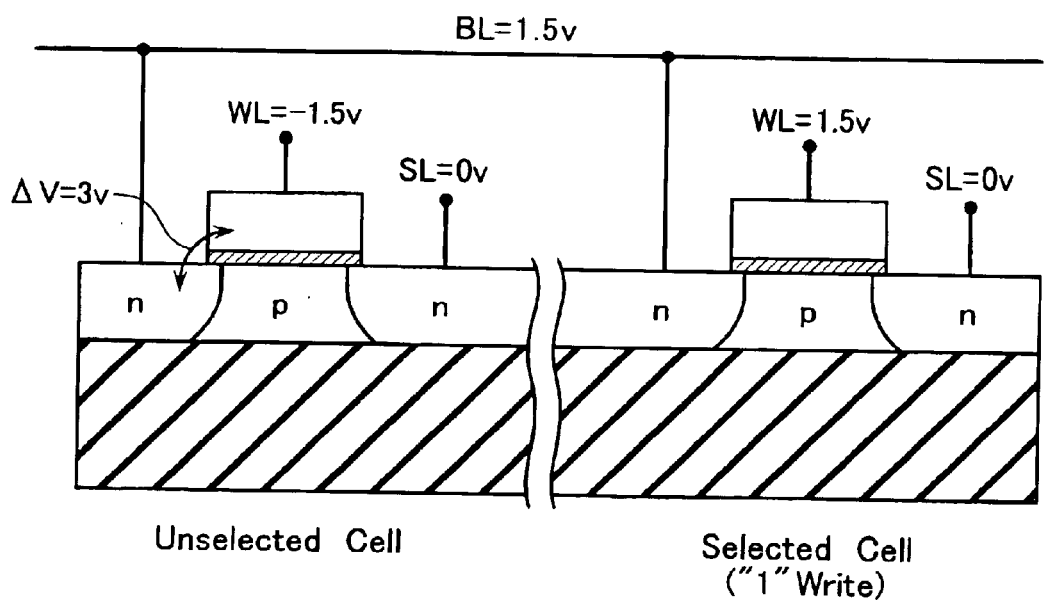
FIG. 29 is a diagram for explaining a problem of the conventional FBC memory.

In the expression (7), V2 is a voltage necessary for maintaining the cell transistor in an off-state, and set at, for example, −1.5V. This voltage V2 may be set at an unselected word line voltage in the data read mode and "0" write mode, or a word line voltage in the data hold mode. The lowest value of the voltage V2 will be determined by the GIDL current in the unselected cell transistor. In the method that impact ionization is used for "1" writing, 1.5V is applied to the bit line (i.e., drain) as shown in FIG. 29. Therefore, the unselected word line being set at −1.5V or lower, a large GICL current is carried in the unselected cell.

To the contrary, within the three types of "1" write condition, the unselected bit line voltage, 1V, in the condition shown in FIG. 16 becomes a maximum drain voltage. Therefore, it is possible to set the word line voltage to be lower than −1.5V. For example, applying the "1" write condition shown in FIG. 11 and the read condition shown in FIG. 13, the maximum drain voltage is the selected bit line voltage 0.2V in the read mode. In an assumption that drain-gate voltage being equal to or lower than 3V, the influence of GIDL current may be ignored, it is possible to lower the voltage V2 to be −2.8V.

On the other hand, if the drain-source voltage of the unselected cell C1 shown in FIG. 17 is 0V, it is possible to set the selected word line voltage VWLS at higher than the unselected word line voltage VWLU. In other words, the following expression (8) may be used.

$$VWLS > VWLU \qquad (8)$$

For example, in a case that voltage VELS of the selected emitter line EL(sel.) is 0V, and voltage VBLU of the selected bit line BL(sel.) is 0V, it is possible to set the selected word line voltage at VWLS=1.5V. This corresponds to the "1" write bias condition shown in FIG. 15, and the unselected cell C1 is prevented from being erroneously written due to GIDL.

Further, assume that the voltage V0 in the expressions (1) and (2) is 0.3V, and it is able to lower the voltage VBLU of the unselected bit line BL(unsel.) to be 0.7V under the "1" write bias condition shown in FIG. 15. Since the lower the bit line voltage, the more reduced the GIDL current, it is preferred to lower the bit line voltage for the purpose of preventing the erroneous write.

[Write Sequence]

In the case that impact ionization is used for "1" data writing, applying different voltages to bit lines of plural cells with a shared word line, it is possible to simultaneously write "0" and "1" into them. By contrast, in this embodiment in which bipolar write is used, it is not easy to simultaneously write "0" and "1" into plural cells with a shared word line, while source lines thereof being fixed in potential.

Figure 18:
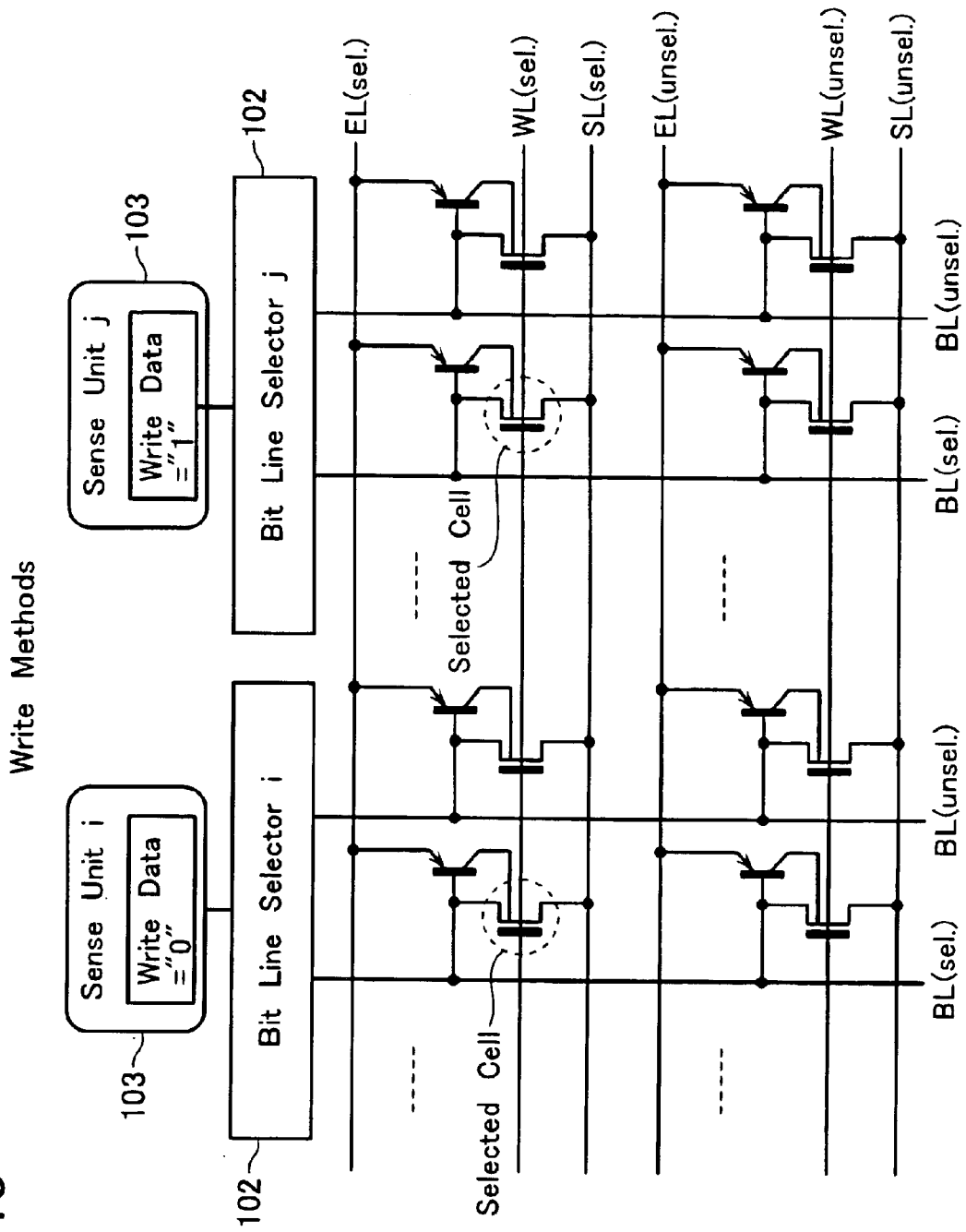
FIG. 18 is a diagram for explaining a write sequence in the embodiment.

Accordingly, data write in this embodiment is preferably done for plural cells disposed along a selected word line with two steps as "1" and "0" write timings are different from each other. Such data write modes will be described in detail bellow. FIG. 18 shows a state that write data "0" and "1" are latched in two sense units. Necessary voltages in response to these write data being applied to bit lines BL(sel.) selected by bit line selectors 102, the write data are written into cells selected by word line WL(sel.) and emitter line EL(sel.). Four write sequences, "Write Sequence 1" to "Write Sequence 4", shown in FIGS. 19 to 22 may be used in these data write modes.

Figure 19:
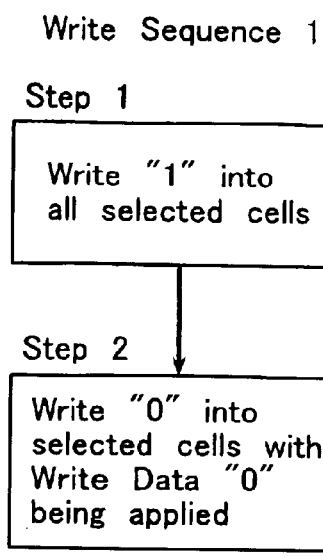
FIG. 19 is a diagram showing a first write sequence.

In Write Sequence 1 shown in FIG. 19, "1" write is done into all cells selected by a selected word line WL(sel.) and plural selected bit lines BL(sel.) at a first step 1. At this step 1, "1" write-use voltage, for example −1V, is applied to all selected bit lines BL(sel.) without regard to latched data. At the same time, 0V is applied to the selected emitter line EL(sel.), and −1.5V to the selected word line WL(sel.) as similar to the unselected word line WL(unsel.). This write condition is the same as that of the write type, Type1, as shown in FIG. 11. Therefore, holes being injected from the emitter layers into channel bodies, "1" data is written into all selected cells.

At a second step 2, "0" write is done into cells, to which "0" data is supplied, in all selected cells. In detail, 1.5V is applied to the selected word line WL(sel.), and −1V to the selected emitter line EL(sel.) and the selected bit lines BL(sel.) to which data "0" is applied. To the remaining selected bit lines BL(sel.), to which data "1" is applied, a voltage necessary for holding "1" data is applied after the step 1. As a result, holes being released from the channel bodies of the selected cells to which "0" data is applied, "0" write is done only for such selected cells.

Figure 20:
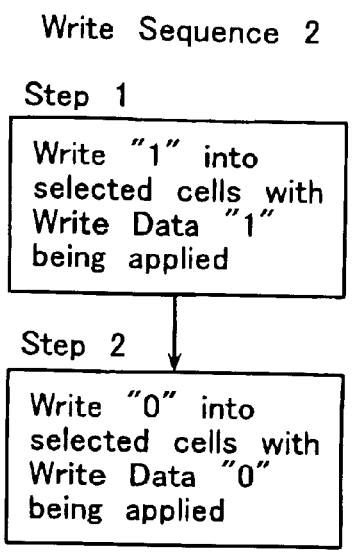
FIG. 20 is a diagram showing a second write sequence.

In Write Sequence 2 shown in FIG. 20, "1" write is done into cell(s), to which write data "1" is applied in the entire cells selected by the selected word line WL(sel.), at a first step 1. At this time, to the selected bit lines BL(sel.), different voltages are applied corresponding to write data "1" and "0". In detail, −1V is applied to the selected bit lines BL(sel.) to which "0" data is applied, and 0V to the remaining selected bit lines BL(sel.) to which "1" data is applied as similar to the unselected bit lines BL(unsel.). At the same time, 0V is applied to the selected emitter line EL(sel.), and −1.5V to the selected word line WL(sel.) as similar to the unselected word line WL(unsel.). As a result, "1" data is written into the selected cells to which "1" data is to be written. At a second step 2, "0" write is done into cells, to which "0" data is supplied, in all selected cells as similar to that shown in FIG. 19.

Figure 21:
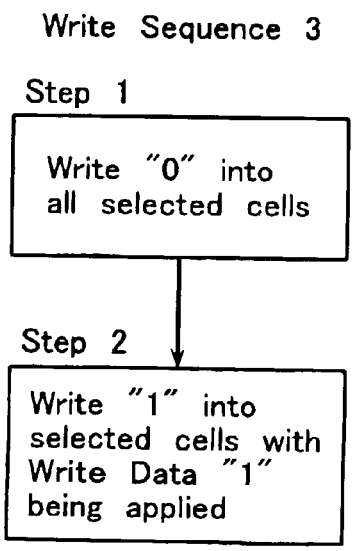
FIG. 21 is a diagram showing a third write sequence.

In Write Sequence 3 shown in FIG. 21, "0" write is done into all cells selected by the selected word line WL(sel.) and plural selected bit lines BL(sel.) at a first step 1. At this step 1, "0" write-use voltage, for example −1V, is applied to all selected bit lines BL(sel.) without regard to latched data. At the same time, −1V is applied to the selected emitter line EL(sel.), and 1.5V to the selected word line WL(sel.). As a result, excessive holes in the channel bodies being released to the drains, "0" data is written into all selected cells.

At a second step 2, "1" write is done into cells, to which "1" data is supplied, in all selected cells. In detail, −1.5V is applied to the selected word line WL(sel.), 0V to the selected emitter line EL(sel.), and −1V to the selected bit lines BL(sel.) to which data "1" is applied. The remaining selected bit lines BL(sel.), to which data "0" is applied, is held at 0V after the step 1. As a result, holes being injected from the emitter layers into the channel bodies in the selected cells to which "1" data is applied, "1" write is done only for such selected cells.

Figure 22:
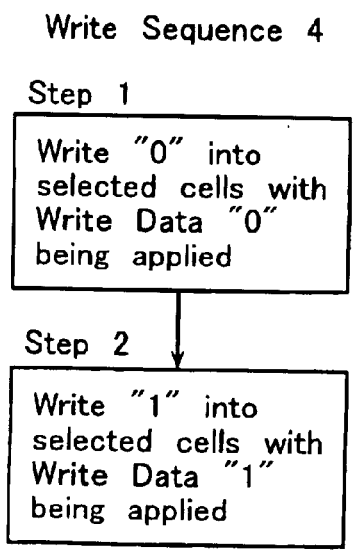
FIG. 22 is a diagram showing a fourth write sequence.

In Write Sequence 4 shown in FIG. 22, two steps are reversed in contrast to Write Sequence 2 shown in FIG. 20. "0" write is done into cell(s) to which write data "0" is applied in the cells selected by the selected word line WL(sel.) at a first step 1. At this time, to the selected bit lines BL(sel.), different voltages are applied corresponding to write data "1" and "0". In detail, −1V is applied to the selected bit lines BL(sel.) to which "0" data is applied, and 0V to the remaining selected bit lines BL(sel.), to which "1" data is applied, as similar to the unselected bit lines BL(unsel.). At the same time, −1V is applied to the selected emitter line EL(sel.), and 1.5V to the selected word line WL(sel.). As a result, "0" data is written into the selected cells to which "0" data is to be written. At a second step 2, "1" write is done into cells, to which "1" data is supplied, in all selected cells as similar to that shown in FIG. 21.

Within the above described 4-type write sequences, Write Sequence 1 to Write Sequence 4, Write Sequences 2 and 4 shown in FIGS. 20 and 22 respectively, in each of which data write is done only once for each selected cell, are advantageous in a fact that wasteful power consumption is less than that of Write Sequences 1 and 3 in which all selected cells are written at the first step 1. Further, the power consumptions are different between Write Sequences 1 and 3. In consideration of these view points, it is possible to use an appropriate write sequence.

In the above described write sequences, it is effective to add a function as follows: detecting that all write data are "1" or "0" based on the write data loaded in the data latches of the sense units 103, the write operation is ended by doing only one step writing. Such the data detection may also be possible based on write data prior to having being loaded in the sense units 103.

Figure 23:
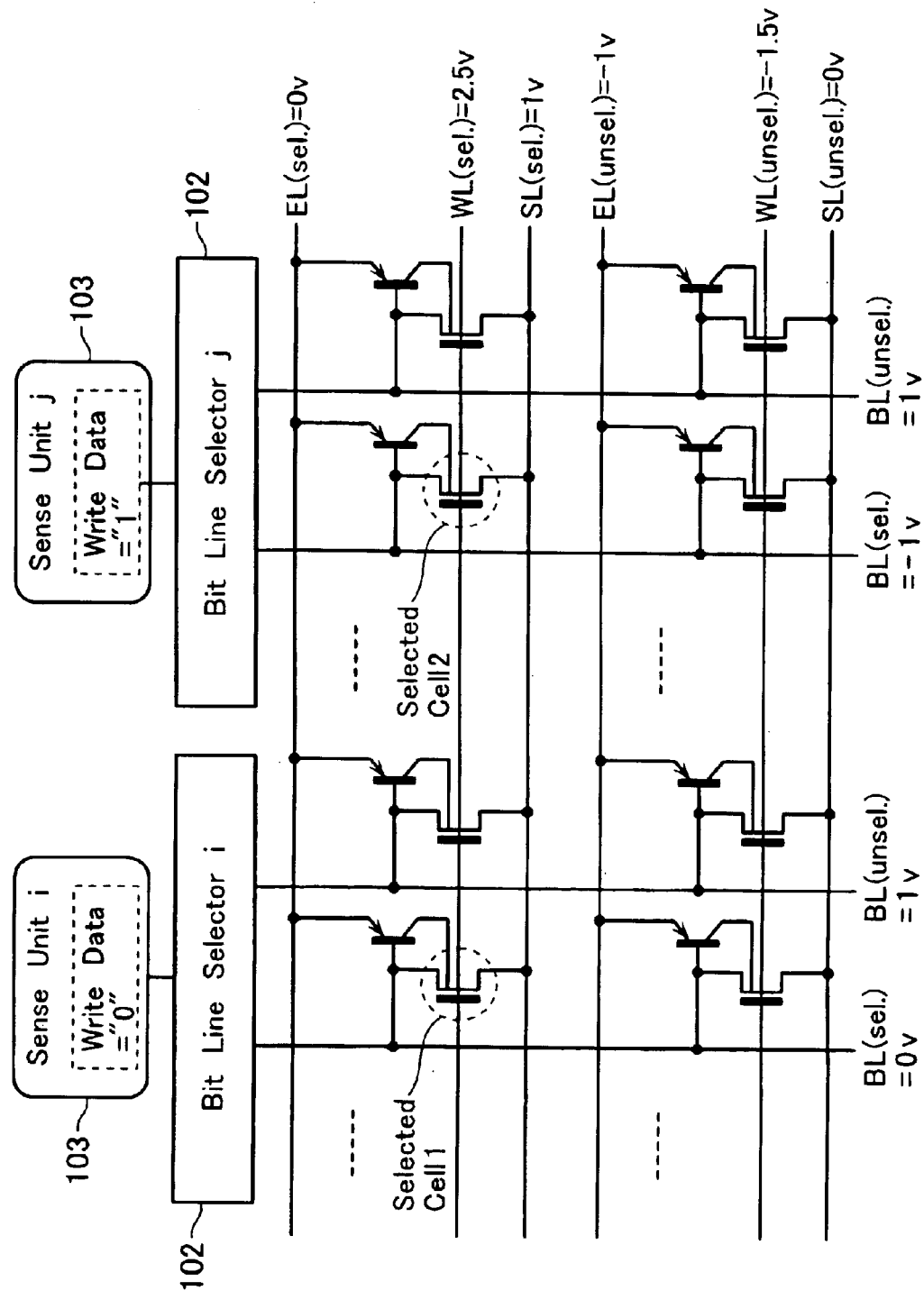
FIG. 23 shows a bias condition for simultaneously writing "0" and "1" data.
Figure 24:
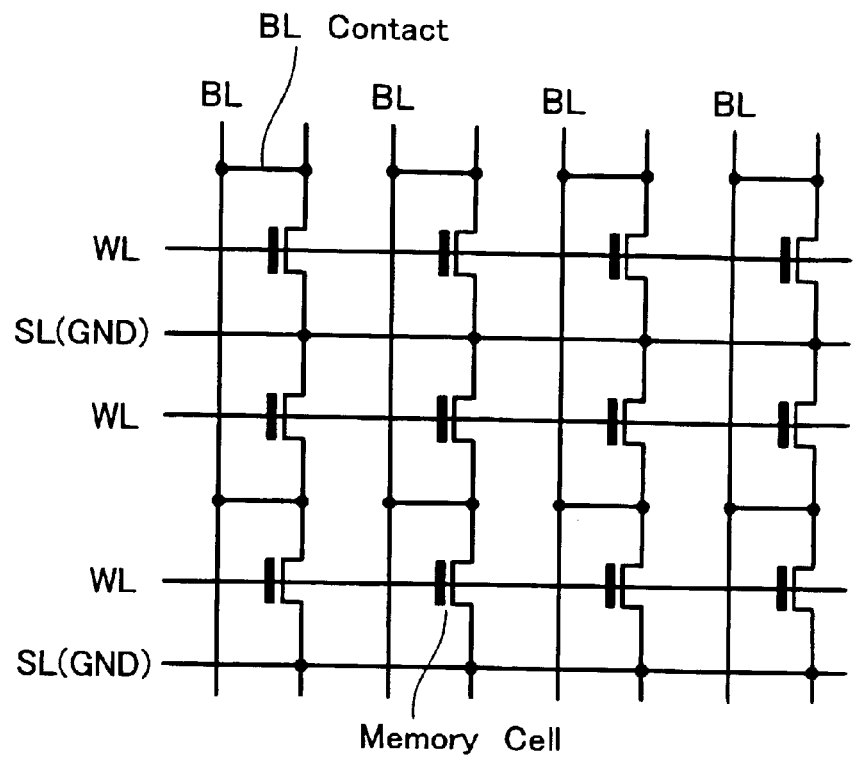
FIG. 24 shows an equivalent circuit of a cell array of a conventional FBC memory.
Figure 25:
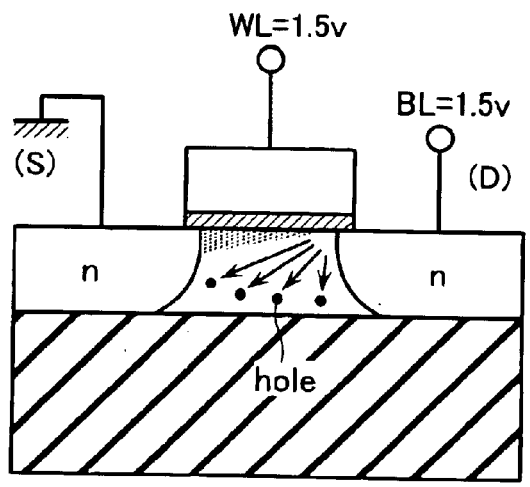
FIG. 25 is a diagram for explaining a "1" write operation of the conventional FBC memory.
Figure 26:
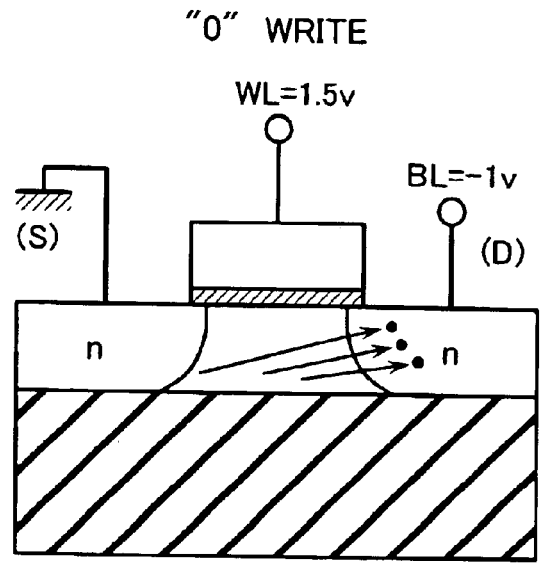
FIG. 26 is a diagram for explaining a "0" write operation of the conventional FBC memory.
Figure 27:
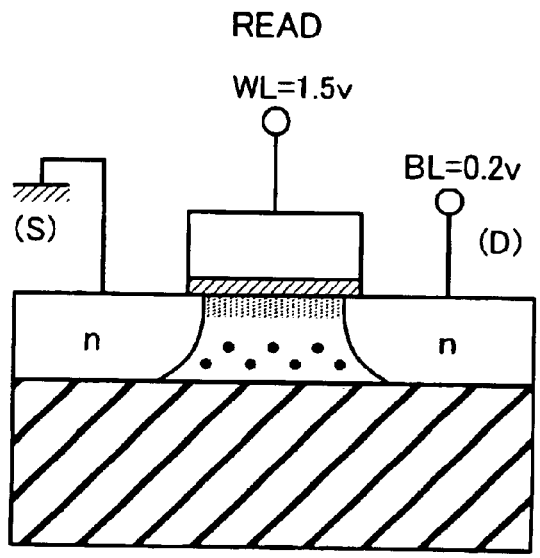
FIG. 27 is a diagram for explaining a read operation of the conventional FBC memory.
Figure 28:
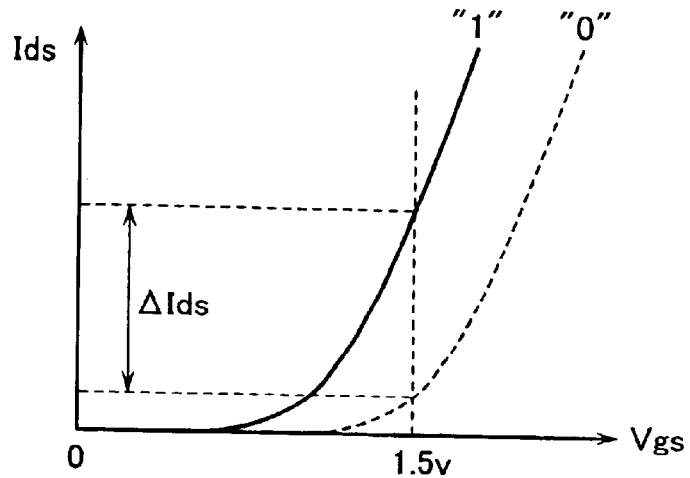
FIG. 28 is a diagram showing a voltage-current characteristic of the FBC.

It should be appreciated that applying different voltages to the source line SL in correspondence with whether it is selected or not, it becomes possible to simultaneously write "0" and "1" into all cells disposed along a selected word line WL. A bias condition of such the data write method is shown in FIG. 23. This case is one that "0" and "1" are written into cells, "Cell1" and "Cell2", respectively, which are selected by two selected bit lines BL(sel.) and one selected word line WL(sel.).

As shown in FIG. 23, Apply 2.5V, 0V and 1V to the selected word line WL(sel.), selected emitter line EL(sel.) and selected source line SL(sel.), respectively; apply −1.5V, −1V and 0V to the unselected word lines WL(unsel.), unselected emitter lines EL(unsel.) and unselected source lines SL(unsel.), respectively: apply 0V to the selected bit line BL(sel.) connected to "Cell1" to which "0" is to be written; apply −1V to the selected bit line BL(sel.) connected to "Cell2" to which "1" is to be written; and apply 1V to unselected bit lines BL(unsel.).

Under such the bias condition, one selected cell, Cell1, being under a "0" write condition with a similar voltage relationship as that shown in FIG. 12, data "0" is written into it. The other sell, Cell2, being under a condition that the bipolar transistor turns on, data "1" is written into it. Although a relatively high voltage is applied to the selected word line WL(sel.), a positive voltage is applied to the selected source line SL(sel.), thereby preventing the data in unselected cells disposed along the selected word line WL(sel.) from being destroyed. All unselected cells disposed along the unselected word lines WL(unsel.) also hold data as it is.

[Effect of the Embodiment]

As described above, in the FBC memory of this embodiment, "1" write is performed by employing a bipolar operation in place of impact ionization. Therefore, it is possible to shorten the time length necessary for "1" writing. Further, there is no any fear of erroneously writing due to the GIDL current. In addition, wasteful power consumption may be reduced unlike the conventional case in which impact ionization is used.

Further, the threshold difference $\Delta$Vth between "0" and "1" cells in this embodiment becomes larger than that of the conventional case in which impact ionization is employed. The reason of this will be explained bellow. In the FBC, there are diffusion capacitances (junction capacitances) between the channel body and source, drain layers. In the "1" write method using impact ionization, after having written, the bit line voltage is pulled down to 0V from 1.5V. At this time, the channel body potential is also pulled down due to capacitice coupling between the channel body and drain layer. This leads to reduction of the signal amount of "1" data.

By contrast, in the "1" write method of this embodiment, bit line voltage is pulled up after having written. For example, in the write types "Type1" and "Type2" shown in FIGS. 11 and 15, bit line voltage becomes 1V from 0V. Therefore, signal amount of "1" data is not reduced after having written.

As a result of device simulation, it,was confirmed that the threshold difference $\Delta$Vth between "0" and "1" cells in the case using bipolar write increases by 40% in comparison with the "1" write using impact ionization.

The difference between this embodiment and the similar arts is clear. For example, in the memory described in the Patent Document 3, carrier injection into the channel body is done by a MOS transistor operation. Further, in the cell layout shown in the Patent Document 3, first and second wirings corresponding to the word lines WL and bit lines BL in this embodiment are disposed in parallel with each other, and third wirings corresponding to the emitter lines EL are disposed perpendicular to the first and second wirings. As a result of such the layout, the plural cells arranged along the word lines are set in either a simultaneously selected state or a simultaneously unselected state. Unlike this embodiment, it is not permitted that unselected cells sharing a word line with selected cells exist.

In addition, in the memory described in the Patent Document 3, as a result of the above described layout, it is required to dispose sense amplifiers each connected to a bit line. As described above, since a current sensing type sense amplifier occupies a relatively large area, it is difficult to dispose sense amplifiers for the respective bit lines in a cell array with a miniaturized bit line pitch.

While the cell array configurations shown in the Patent Documents 4 and 5 are basically the same as that of Patent Document 3, these are formed as being more complicated, and a unit cell area thereof is large. In addition, while the Patent Document 5 refers to an inherent bipolar transistor, this is a parasitic bipolar transistor inevitably formed with a MOS transistor, and apparently different from that is this embodiment.

This invention is not limited to the above-described embodiment. For example, while it has been explained that an NMOS transistor is used as a cell transistor, it should be appreciated that the memory cell may be formed with a PMOS transistor formed on an N-type semiconductor layer. In such the case, an NPN transistor is used as the bipolar transistor serving for bipolar writing. Further, it will be understood by those skilled in the art that various changes in form and detail may be made without departing from the spirit, scope, and teaching of the invention.

What is claimed is:

1. A semiconductor integrated circuit device comprising:
    a substrate;
    a first conductivity type of semiconductor layers arranged above said substrate as being insulated from said substrate and insulated from each other;
    cell transistors formed on the respective semiconductor layers, each of which has a second conductivity type of source, drain layers and a gate electrode to store data in a channel body thereof corresponding to an accumulation state of majority carriers; and
    the first conductivity type of emitter layers formed in the respective semiconductor layers to be contacted to the respective drain layers of said cell transistors so as to constitute PN junctions therebetween, the emitter layers serving for injecting majority carriers into the respective channel bodies of said cell transistors.

2. The semiconductor integrated circuit device according to claim 1, wherein
    memory cells, each of which is formed of said cell transistor and the corresponding emitter layer, are arranged in a matrix manner to constitute a cell array, and wherein said cell array comprises word lines each commonly connected to the gate electrodes of said cell transistors arranged in a first direction of the matrix, bit lines each commonly connected to the drain layers of said cell transistors arranged in a second direction of the matrix, source lines each commonly connected to the source layers of said cell transistors arranged in the first direction, and emitter lines each commonly connected to the emitter layers arranged in the first direction.

3. The semiconductor integrated circuit device according to claim 2, wherein said memory cells are formed on the respective semiconductor layers.

4. The semiconductor integrated circuit device according to claim 2, wherein adjacent two memory cells are formed on each of said semiconductor layers arranged in the second direction with a shared source layer.

5. The semiconductor integrated circuit device according to claim 2, wherein each said cell transistor stores one of first and second data states, the first data state being defined as a state that holds excessive majority carriers in the channel body, the second data state being defined as a state that holds less majority carriers than the first data state.

6. The semiconductor integrated circuit device according to claim 5, wherein the first data state of said cell transistor is written by applying a forward bias between the drain layer and the corresponding emitter layer so as to inject majority carriers from the emitter layer into the channel body, and wherein the second data state of said cell transistor is written by releasing the majority carries held in the channel body toward the drain layer.

7. The semiconductor integrated circuit device according to claim 5, wherein the first data state is written under the condition of $VBLS+V1 \leq VELS$, $VELS \leq VBLU+V0$ and $VELU \leq VBLS+V0$, where VBLS is a selected bit line voltage; VBLU an unselected bit line voltage; VELS a selected emitter line voltage; VELU an unselected emitter line voltage; V1 a voltage necessary for forward-biasing the PN junction between the drain and emitter layers; and V0 a voltage insufficient for forward-biasing the PN junction between the drain and emitter layers.

8. The semiconductor integrated circuit device according to claim 7, wherein during the first data state is written, a voltage is applied to the entire word lines to turn off said cell transistors.

9. The semiconductor integrated circuit device according to claim 7, wherein during the first data state is written, a voltage is applied to unselected word lines to turn off said cell transistors, and another voltage is applied to a selected word lines as being higher than that applied to the unselected word lines.

10. The semiconductor integrated circuit device according to claim 7, wherein data writing operations of the first and second data states for plural memory cells with a shared word line are performed at different timings from each other.

11. The semiconductor integrated circuit device according to claim 5, further comprising:

current sensing type sense amplifiers smaller in number than said memory cells arranged in the first direction of said cell array; and bit line selectors for connecting selected bit lines in said cell array to the corresponding sense amplifiers.

12. The semiconductor integrated circuit device according to claim 11, wherein said device has a data write mode with first and second steps, the first step serving for writing the first data state into the entire memory cells selected by said bit line selectors, the second step serving for writing the second data state into memory cells into which the second data state is to be written.

13. The semiconductor integrated circuit device according to claim 11, wherein said device has a data write mode with first and second steps, the first step serving for writing the second data state into the entire memory cells selected by said bit line selectors, the second step serving for writing the first data state into memory cells into which the first data state is to be written.

14. The semiconductor integrated circuit device according to claim 11, wherein said device has a data write mode with first and second steps, the first step serving for writing the first data state into some ones in memory cells selected by said bit line selectors, into which the first data is to be written, the second step serving for writing the second data state into the others in memory cells selected by said bit line selectors, into which the second data state is to be written.

15. The semiconductor integrated circuit device according to claim 11, wherein said device has a data write mode with first and second steps, the first step serving for writing the second data state into some ones in memory cells selected by said bit line selectors, into which the second data is to be written, the second step serving for writing the first data state into the others in memory cells selected by said bit line selectors, into which the first data state is to be written.

16. The semiconductor integrated circuit device according to claim 11, wherein said device has a data write mode that data write operations of the first and second data states are simultaneously performed for the entire memory cells selected by said bit line selectors.

17. A semiconductor integrated circuit device comprising:

a substrate;

a first conductivity type of semiconductor layers arranged above said substrate as being insulated from said substrate and from each other;

cell transistors formed on the respective semiconductor layers, each of which has a second conductivity type of source, drain layers and a gate electrode to store data in a channel body thereof corresponding to an accumulation state of majority carriers; and bipolar transistors each having the first conductivity type of emitter layer formed to be contacted to each the drain layer, and having base and collector layers defined by the drain layer and channel body of each said cell transistor respectively, wherein each said cell transistor stores one of first and second data states, the first data state being defined as a state that holds excessive majority carriers in the channel body thereof, the second data state being defined as a state that holds less majority carriers than the first data state.

18. The semiconductor integrated circuit device according to claim 17, wherein the first data state of said cell transistor is written by turning on the corresponding bipolar transistor to inject majority carriers from the emitter layer into the channel body via the drain layer, and wherein the second data state of said cell transistor is written by releasing the majority carries held in the channel body toward the drain layer while letting the corresponding bipolar transistor be off.

* * * * *